(12) United States Patent
Wong et al.

(10) Patent No.: US 11,275,677 B2
(45) Date of Patent: Mar. 15, 2022

(54) HIGH EFFICIENCY INTERACTIVE TESTING PLATFORM

(71) Applicant: Netflix, Inc., Los Gatos, CA (US)

(72) Inventors: Jeffrey Wong, Mountain View, CA (US); Colin McFarland, Los Gatos, CA (US); Matthew Wardrop, San Jose, CA (US); Nikolaos Diamantopoulos, San Francisco, CA (US); Pablo Lacerda de Miranda, San Jose, CA (US); Tobias Mao, San Mateo, CA (US); Eskil Forsell, Campbell, CA (US); Julie Beckley, San Jose, CA (US)

(73) Assignee: Netflix, Inc., Los Gatos, CA (US)

( * ) Notice: Subject to any disclaimer, the term of this patent is extended or adjusted under 35 U.S.C. 154(b) by 0 days.

(21) Appl. No.: 17/003,523

(22) Filed: Aug. 26, 2020

(65) Prior Publication Data

US 2021/0064517 A1 Mar. 4, 2021

Related U.S. Application Data

(60) Provisional application No. 63/052,374, filed on Jul. 15, 2020, provisional application No. 63/030,666,
(Continued)

(51) Int. Cl.
*G06F 11/00* (2006.01)
*G06F 11/36* (2006.01)

(52) U.S. Cl.
CPC ...... *G06F 11/3688* (2013.01); *G06F 11/3664* (2013.01); *G06F 11/3684* (2013.01)

(58) Field of Classification Search
CPC ............ G06F 11/3688; G06F 11/3664; G06F 11/3684; G06F 11/3692; G06F 11/3672; G06F 11/3668; G06F 11/3696
See application file for complete search history.

(56) References Cited

U.S. PATENT DOCUMENTS

| | | | |
|---|---|---|---|
| 9,104,582 B1* | 8/2015 | Mukundan | G06F 12/0871 |
| 2014/0101485 A1* | 4/2014 | Wegener | H03M 7/3068 |
| | | | 714/32 |

(Continued)

FOREIGN PATENT DOCUMENTS

WO 2021/041582 A1 3/2021

OTHER PUBLICATIONS

International Search Report and Written Opinion received for PCT Application Serial No. PCT/US2020/048059 dated Dec. 14, 2020, 13 pages.

(Continued)

*Primary Examiner* — Katherine Lin
(74) *Attorney, Agent, or Firm* — FisherBroyles, LLP

(57) ABSTRACT

The disclosed computer-implemented method includes accessing data that is to be used as part of a test implementation that has multiple potential outcomes. The method also includes determining that the test implementation is to be carried out using specified testing algorithms that test for at least one of the potential outcomes. The method next includes identifying portions of the accessed data that are to be used in the specified testing algorithms, and compressing the identified portions of the accessed data to remove portions of the accessed data that are unused in the specified testing algorithms. The method also includes executing the test implementation using the specified testing algorithms with the compressed accessed data. Various other methods, systems, and computer-readable media are also disclosed.

20 Claims, 11 Drawing Sheets

Related U.S. Application Data filed on May 27, 2020, provisional application No. 62/975,081, filed on Feb. 11, 2020, provisional application No. 62/940,813, filed on Nov. 26, 2019, provisional application No. 62/892,458, filed on Aug. 27, 2019, provisional application No. 62/892,466, filed on Aug. 27, 2019.

(56) References Cited

U.S. PATENT DOCUMENTS

| | | | | |
|---|---|---|---|---|
| 2015/0244624 | A1* | 8/2015 | Asiano | H04B 1/0003 370/235 |
| 2017/0171054 | A1* | 6/2017 | Howcroft | H04L 43/0888 |
| 2017/0316122 | A1 | 11/2017 | Xu et al. | |
| 2018/0024916 | A1* | 1/2018 | Shazly | G06F 11/3696 717/124 |
| 2019/0332849 | A1 | 10/2019 | Gupta et al. | |
| 2020/0097809 | A1 | 3/2020 | Velasco et al. | |
| 2020/0285960 | A1 | 9/2020 | Zhao et al. | |
| 2020/0286112 | A1 | 9/2020 | Zhou et al. | |
| 2020/0363972 | A1* | 11/2020 | Krasner | H04L 9/0643 |
| 2021/0064517 | A1 | 3/2021 | Wong et al. | |

OTHER PUBLICATIONS

Kathpalia et al., "Causality Testing: A Data Compression Framework", arxiv.org, Cornell University Library, Oct. 11, 2017, pp. 1-5.

International Search Report and Written Opinion received for PCT Application Serial No. PCT/US21/34374 dated Oct. 5, 2021, 17 pages.

Ji et al., "Efficient Interaction-based Neural Ranking with Locality Sensitive Hashing", International World Wide Web Conference Committee, ACM, 2019, pp. 2858-2864.

Yona Gal, "Fast Near-Duplicate Image Search using Locality Sensitive Hashing", Towards Data Science, URL https://towardsdatascience.com/fast-near-duplicate-image-search-using-locality-sensitive-hashing-d4c16058efcb, 2018, 11 pages.

Agrawal Aayush, "Finding similar images using Deep learning and Locality Sensitive Hashing", Towards Data Science, URL: https://towardsdatascience.com/finding-similar-images-using-deep-learning-and-locality-sensitive-hashing-9528afee02f5, 2019, 11 pages.

Kirdey et al., "Machine Learning for a Better Developer Experience", Netflix Technology Blog, URL: https://netflixtechblog.com/machine-learning-for-a-better-developer-experience-1e600c69f36c, 2020, 9 pages.

\* cited by examiner

HIGH EFFICIENCY INTERACTIVE TESTING PLATFORM

CROSS REFERENCE TO RELATED APPLICATION

This application claims priority to and the benefit of U.S. Provisional Patent Application No. 63/052,374, filed Jul. 15, 2020, U.S. Provisional Patent Application No. 63/030,666, filed May 27, 2020, U.S. Provisional Patent Application No. 62/975,081, filed Feb. 11, 2020, U.S. Provisional Patent Application No. 62/940,813, filed Nov. 26, 2019, U.S. Provisional Patent Application No. 62/892,458, filed on Aug. 27, 2019, and U.S. Provisional Patent Application No. 62/892,466, filed on Aug. 27, 2019, the disclosures of each of which are incorporated, in their entirety, by this reference.

BACKGROUND

In today's computing environment, software applications are often configured to run in the cloud, using data that is accessible from any internet-connected device. These applications often have many different features and different types of functionality that they provide for an end user. In some cases, these features may need to be changed or updated over time. As such, entities producing these applications often provide new features or changes to existing features to small subsets of their user base. These features are provided as part of an experiment or test on that group to see how the new or updated feature will perform. Such tests are often referred to as A/B tests, where one test group receives feature A, while the other group receives feature B or receives no changes. Then, the subsequent outcomes for each group are monitored and studied.

In many cases, these A/B tests are designed by engineers or computer programmers. The engineers or programmers typically work with data scientists to design the A/B test, and then execute the test with various groups of users. The results of the test are then provided to the data scientist who studies the resulting numbers and trends and determines whether the new or updated features represent an improvement or not. These tests often implement and rely on large quantities of data to identify meaningful outcomes. As such, these types of tests are configured to run on distributed computing systems including cloud computing systems.

SUMMARY

As will be described in greater detail below, the present disclosure describes systems and methods that provide an interactive testing platform that is not only highly efficient, relying on less data and fewer processing resources than past systems, but also allows users to interact with a test or experiment while that test is running. In one example, a computer-implemented method for implementing an interactive testing platform includes accessing data that is to be used as part of a test implementation that has multiple potential outcomes. The method also includes determining that the test implementation is to be carried out using various specified testing algorithms that test for at least one of the potential outcomes. The method further includes identifying portions of the accessed data that are to be used in the specified testing algorithms and then compressing the identified portions of the accessed data to remove portions of the accessed data that are unused in the specified testing algorithms. The method also includes executing the test implementation using the specified testing algorithms with the compressed accessed data.

In some embodiments, compressing the identified portions of the accessed data to remove portions of the accessed data that are unused in the specified testing algorithms includes categorizing portions of the data that are used in the specified testing algorithms into bins. Each bin includes data for a subset of users that are part of the test implementation. Each bin is labeled with a tag that is part of a schema that tracks those portions of the accessed data that are used by the specified testing algorithms.

In some cases, compressing the identified portions of the accessed data to remove portions of the accessed data that are unused in the specified testing algorithms further includes tracking count, sum, and/or sum of squares. In some examples, compressing the identified portions of the accessed data to remove portions of the accessed data that are unused in the specified testing algorithms is performed by a compression algorithm that is configured for implementation with mathematical models, t tests, covariate adjustments, longitudinal models, quantile bootstrap, and/or quantile regression.

In some examples, compressing the identified portions of the accessed data to remove portions of the accessed data that are unused in the specified testing algorithms includes compression within data clusters that is configured to compress data within various data clusters and/or compression between data clusters that is configured to compress data in different data clusters. In some cases, compressing the identified portions of the accessed data to remove portions of the accessed data that are unused in the specified testing algorithms is performed by a compression algorithm that is tunably lossy. As such, controllers or settings determine how much data loss through compression is tolerable for any given compression operation.

In some embodiments, the test implementation and/or the specified testing algorithms are updated while the test implementation is being executed. In some cases, intermediate test results from the executed test implementation are presented while the test implementation is executing. In some examples, the intermediate test results indicate whether a specified difference in features is having an expected effect.

In addition, a corresponding system includes at least one physical processor and physical memory including computer-executable instructions that, when executed by the physical processor, cause the physical processor to: access data that is to be used as part of a test implementation that has multiple potential outcomes, determine that the test implementation is to be carried out using one or more specified testing algorithms that test for at least one of the potential outcomes, identify portions of the accessed data that are to be used in the specified testing algorithms, compress the identified portions of the accessed data to remove portions of the accessed data that are unused in the specified testing algorithms, and execute the test implementation using the specified testing algorithms with the compressed accessed data.

In some embodiments, the specified testing algorithms are optimized to reduce processing resource usage. In some examples, the specified testing algorithms optimized to reduce processing resource usage comprise testing algorithms that operate using sparse linear algebra. In some cases, the specified testing algorithms optimized to reduce processing resource usage include testing algorithms that operate using summing operations.

In some cases, the physical processor further organizes the compressed accessed data in memory to spatially locate portions of the compressed accessed data next to each other in a data storage medium. In some embodiments, organizing the compressed accessed data in memory to spatially locate portions of the compressed accessed data next to each other in a data storage medium includes arranging the compressed accessed data according to assigned vectors. In some examples, the physical processor further moves a chunk of compressed accessed data, arranged according to the assigned vectors, to a cache memory location located on the physical processor. In some embodiments, matrix sum operations are performed on the chunk of compressed accessed data that was moved to the cache memory location located on the at least one physical processor.

In some examples, the above-described method is encoded as computer-readable instructions on a computer-readable medium. For example, a computer-readable medium includes one or more computer-executable instructions that, when executed by at least one processor of a computing device, cause the computing device to: access data that is to be used as part of a test implementation that has a plurality of potential outcomes, determine that the test implementation is to be carried out using various specified testing algorithms that test for at least one of the potential outcomes, identify portions of the accessed data that are to be used in the specified testing algorithms, compress the identified portions of the accessed data to remove portions of the accessed data that are unused in the specified testing algorithms, and execute the test implementation using the specified testing algorithms with the compressed accessed data.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
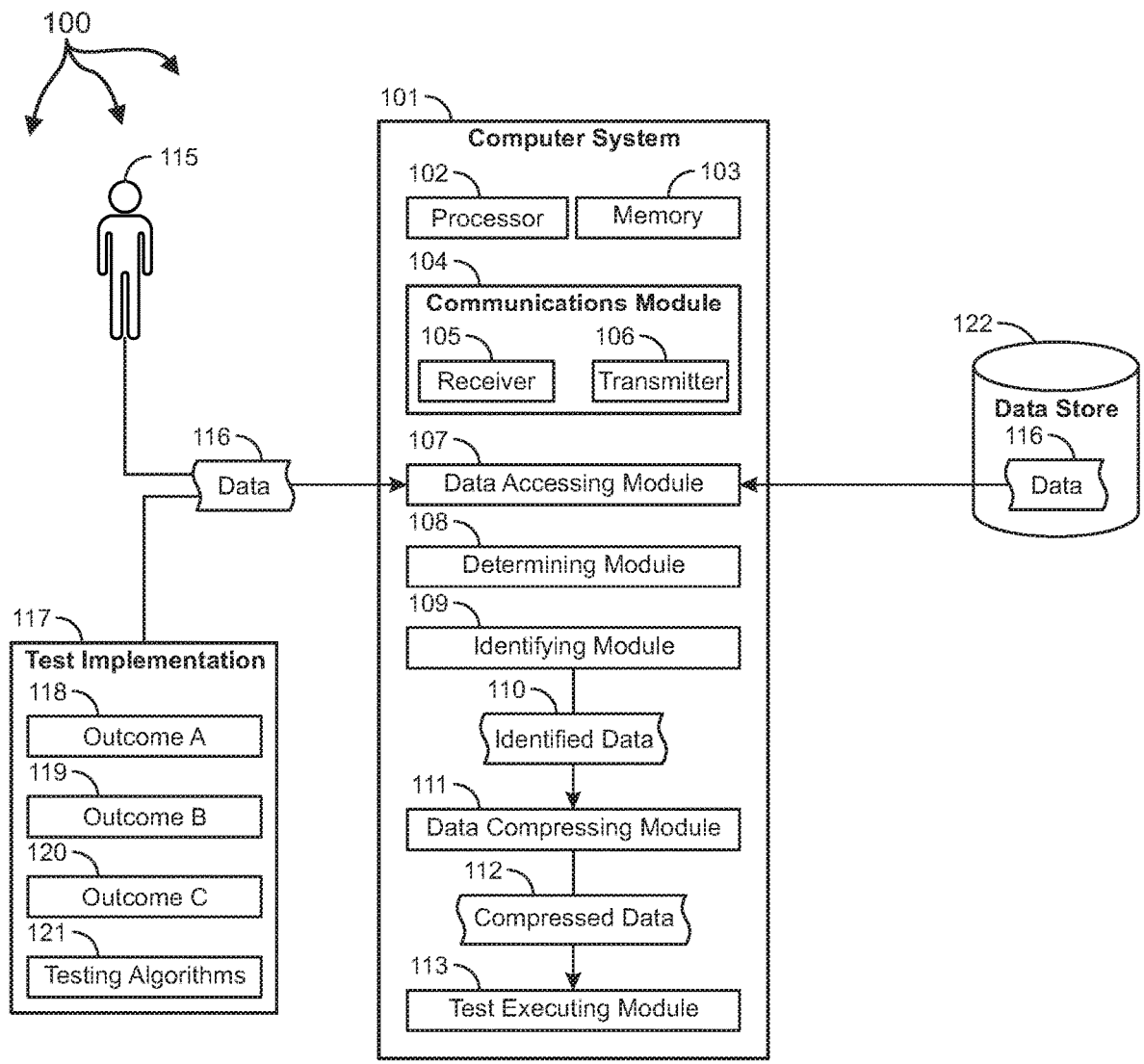
FIG. 1 illustrates a computing environment in which the embodiments herein are designed to operate.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to systems and methods for implementing an interactive testing platform. The interactive testing platform described herein allows users, including data scientists and engineers, to design, create, manage, and analyze different types of experiments or tests, including the A/B tests mentioned above. As further noted above, in many traditional testing scenarios, data scientists who study and interpret the data from the tests are not the ones who create the test. Rather, data scientists will work with engineers or computer programmers to design and implement the test. In traditional systems, this interaction between data scientists and computer programmers may consume a great deal of time. In contrast, the embodiments described herein provide more powerful, more accurate, and more efficient techniques to analyze tests. The software tools described herein enable data scientists to analyze a AB test whenever they want, with very little friction. This gives the data scientists "freedom to operate" and with interactive speeds, without needing larger, powerful systems. Subsequently, this agility allows the data scientists and others they work with to come up with new ideas, which may include making alterations to the test as needed.

Still further, many of these experiments or tests are designed to run on highly powerful, distributed computing systems. Owing to the amounts of data being used in these tests, the data processing can take many hundreds or thousands of parallel processors or processor cores to fully compute. Testing algorithms are traditionally designed to implement dense linear algebra to compute the results. Dense linear algebra is computationally complex and requires multiple processors to operate at a functional speed. These dense linear algebra algorithms are also designed to work with very large amounts of test data. Transferring and using such large quantities of data often takes a commensurate amount of computing resources including disk space, memory space, network bandwidth, and central processing unit (CPU) time. Accordingly, traditional testing systems and algorithms are often inflexible once started and consume large amounts of computing resources during the testing process.

As will be explained in greater detail below, embodiments of the present disclosure allow tests to be designed and implemented by data scientists (or other users) without having to consult an engineer or computer programmer. This allows for much more flexibility when implementing and managing live tests. Still further, the embodiments described herein are configured to present intermediate results while the test is running. In contrast to traditional systems that are designed to generate test results only at the end of the test, the embodiments described herein generate and provide intermediate test results that indicate how the updated software code, for example, is performing in the test relative to the existing code. Data scientists or other users can then interact with these intermediate test results and make changes to the test based on the data identified in the intermediate results.

Still further, the embodiments described herein introduce compression algorithms and techniques that greatly reduce the amount of data used during tests and, as such, greatly reduce the amount of computing resources needed to run a given test. The embodiments described herein look at a specified test implementation and determine which algorithms or formulae or method steps are going to be used as part of the test. The system performing the test then compresses the data that is to be used as part of the test implementation, reducing the data to only those portions that are actually going to be used by the identified testing algorithms. By compressing and reducing the data in this manner, large quantities of data that were previously used in traditional systems are now discarded during the compression process. This data compression allows very specific portions of data to be moved into memory where it can be used by statistical models that implement scientific libraries that are not easily distributable. As a result, in some cases, tests that were previously run using distributed computing systems with multiple different processors can now be run in memory on a single computer system.

Further compression techniques are also used to organize and/or reduce the amount of data used by test implementations. In some cases, for example, the systems herein establish bins into which different portions of data are stored. For instance, the systems running the test implementations may establish a data bin for data associated with each subset of users that are part of the test implementation. In some cases, for instance, these systems establish a bin for data associated with users in the age range of 31-39, and a separate bin for users in the 40-59 age range. In other cases, bins for users from different countries or bins for users viewing certain television programs or movies are established. The data produced from users in each group is stored in that group's corresponding bin.

In some cases, each bin is labeled with a tag that is part of a schema that tracks the data used in the testing algorithms. These schema tags are widely applicable and may be used in substantially any type of testing scenario in any industry. The schema tags indicate which type of data is stored in each bin. Then, the test implementation can access data from certain bins while avoiding data from other bins. In this manner, test implementations do not need to look at all of the available data and, at least in some cases, do not even need to compress all of the available data. Rather, the tests can focus on the data that those tests need by turning to specific, labeled bins. Thus, the compression and data storage optimizations described herein may be applied in a wide variety of different test types, and may be tailored to work in a variety of different industries.

Still further, some aspects of the compression techniques described herein may be applied in a customizable manner. For example, different compression algorithms operate with different levels of data loss (e.g., data that cannot be recovered after compression is complete). Some compression algorithms lose little to no data during operation, while other compression algorithms lose a significant amount of data. In some of the embodiments described herein, the compression algorithms used are tunably lossy. As such, users creating or managing test implementations can tune or change the amount of loss that is acceptable for any given test implementation.

Accordingly, in some cases, a user may indicate that some data loss is ok and that, as a result, the data may be more heavily compressed. Whereas, in other cases, the user may indicate that no data loss is acceptable, and in such cases, the data will be more lightly compressed so that no data loss occurs. In such examples, the embodiments described herein allow users to select the amount of compression and data loss that is to occur for each test, and further allow users to change that selection later on while the test is running if desired. In still other cases, controllers are configured to analyze the testing algorithms that are to be used in a given test and determine how much data loss through compression is tolerable for that test. In such cases, the controller then tunes or selects the amount of compression that will be applied to the data in that test.

In addition to compressing the data in a customizable manner, the embodiments described herein are also configured to spatially locate the data in memory and/or in data storage so that the data is more quickly accessible and is more easily moved to different locations. For example, the embodiments described herein may be configured to store the data from a single bin in a contiguous data block on a hard disk or in non-volatile memory (e.g., in RAM or in processor cache memory). Then, when the data is accessed, the contiguous nature of the data ensures that the data is read more quickly by the storage medium. Still further, if that data is to be moved to another location (e.g., for faster processing), that data can be quickly accessed as a single data chunk and moved to the new location.

For instance, in some cases, the test implementations described herein are designed to run in L2/L3 processor cache memory. The L2 and L3 processor caches are relatively small in size compared to disk storage, but processors can access data in these caches much faster and more efficiently than accessing the data from disk. Because the embodiments described herein are designed to compress the data to such a high degree, many test implementations (or at least parts thereof) can be moved to a processor's L2/L3 processor cache for processing. Still further, many of the algorithms described herein are designed to perform different types of operations that are quicker to perform. For instance, the algorithms described herein may implement matrix summing operations (as opposed to matrix multiplication operations), which are much faster to process.

Thus, by combining data spatially located together as a single block, by combining various forms of compression which allow the data to fit onto L2/L3 processor cache, and by providing new algorithms that operate using less mathematically complex operations, the embodiments described herein can perform tests much, much quicker than traditional systems. Indeed, tests that were previously completed only across multiple distributed computing systems and across multiple hours or days, can now be completed in a matter of a few minutes, on a single laptop or personal computing system, while providing intermediate test results and while remaining changeable if needed. In addition to optimizations for data volume and data movement, the embodiments herein provide new algorithms to calculate causal effects directly, bypassing many unnecessary computations that are found in correlational analyses. These concepts will be described in greater detail below with regard to FIGS. 1-9 and with regard to the systems of FIGS. 10-12.

FIG. 1 illustrates a computing environment 100 that includes a computer system 101. The computer system 101 includes software modules, embedded hardware components such as processors, or includes a combination of hardware and software. The computer system 101 includes substantially any type of computing system including a local computing system or a distributed (e.g., cloud) computing system. In some cases, the computer system 101 includes at least one processor 102 and at least some system memory 103. The computer system 101 includes program modules for performing a variety of different functions. The program modules are hardware-based, software-based, or include a combination of hardware and software. Each program module uses computing hardware and/or software to perform specified functions, including those described herein below.

The computer system 101 includes a communications module 104 that is configured to communicate with other computer systems. The communications module 104 includes any wired or wireless communication means that can receive and/or transmit data to or from other computer systems. These communication means include hardware interfaces including Ethernet adapters, WIFI adapters, hardware radios including, for example, a hardware-based receiver 105, a hardware-based transmitter 106, or a combined hardware-based transceiver capable of both receiving and transmitting data. The radios are cellular radios, Bluetooth radios, global positioning system (GPS) radios, or other types of radios. The communications module 104 is configured to interact with databases, mobile computing devices (such as mobile phones or tablets), embedded or other types of computing systems.

The computer system 101 also includes a data accessing module 107. The data accessing module 107 is configured to access data 116 that is either being used in a test or is generated by the test. For example, in some cases, the computer system 101 initiates an experiment or "test implementation." The test implementation introduces new software features or updates to certain features, or provides various software features to different user groups. Many other types of test or experiments may also be used. Each of these tests has different potential outcomes (e.g., outcomes 118-120). The tests are run using certain portions of input data and, while the tests are running, the tests generate output data. Regardless of whether the data 116 is input data or output data, the data accessing module 107 of computer system 101 is configured to access that data. In some cases, the data accessing module 107 accesses the data 116 from a data store (e.g., 122), while in other cases the data accessing module 107 accesses the data 116 from a user 115 (or a user's mobile device) or from another computer system.

Once the data accessing module 107 has accessed the data 116, the determining module 108 of computer system 101 determines which testing algorithms 121 are to be used as part of the test implementation 117. The test implementation 117 may use substantially any number of different testing algorithms 121. The determining module 108 of computer system 101 is configured to determine which testing algorithms 121 are to be used as part of each specific test implementation. The identifying module 109 of computer system 101 then identifies which portions of the data 116 are to be used with the testing algorithms 121 that were determined to be used in test implementation 117. When A/B tests or other types of tests or experiments are being run on a software application, each test uses different types or different quantities of information in its testing algorithms. Thus, in one example, the test implementation 117 uses testing algorithms A and B, while another test implementation uses algorithms C and D. In this example, algorithms A and B use different input data than algorithms C and D. As such, the identifying module 109 will identify those portions of data 110 that will actually be used by the testing algorithms in that test implementation 117. Other data that is part of data 116 is discarded or reduced in size.

For example, in some embodiments, the data compressing module 111 of computer system 101 compresses those portions of data 110 identified by the identifying module 109, such that the data that will actually be used by the testing algorithms is compressed (i.e., reduced in size) and the data that will not be used by the testing algorithms is discarded or is otherwise removed from use. Accordingly, the resulting compressed data 112 excludes substantially all data 116 not used by the testing algorithms 121 being used in the test implementation 117 and, at least in some cases, also includes a compressed version of the data that is to be used by the testing algorithms for the test implementation 117. The test executing module 113 then executes the test implementation 117 using the compressed data 112. Because the compressed data 112 is so heavily compressed, the test executing module 113 is able to execute the test implementation 117 on a single computer system using a single processor. These concepts will be described in greater detail with regard to Method 200 of FIG. 2, and with further regard to FIGS. 3-12.

Figure 2:
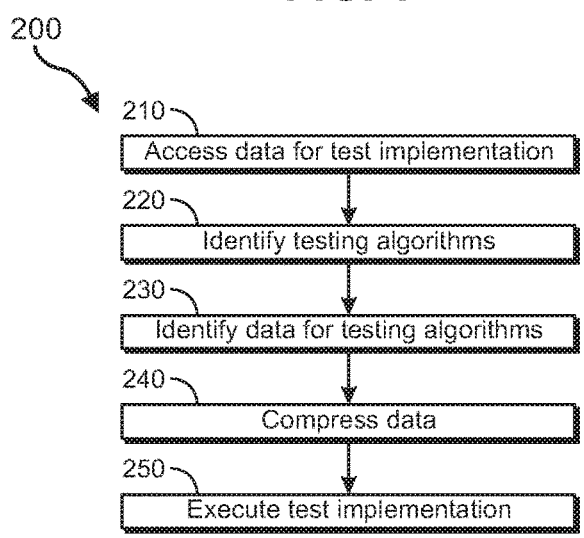
FIG. 2 illustrates a flow diagram of an exemplary method for implementing an interactive testing platform.

FIG. 2 is a flow diagram of an exemplary computer-implemented method 200 for implementing an interactive testing platform. The steps shown in FIG. 2 are performed by any suitable computer-executable code and/or computing system, including the system illustrated in FIG. 1. In one example, each of the steps shown in FIG. 2 represents an algorithm whose structure includes and/or is represented by multiple sub-steps, examples of which will be provided in greater detail below.

As illustrated in FIG. 2, at step 210, one or more of the systems described herein accesses data that is to be used as part of a test implementation that has multiple potential outcomes. As noted above, the test implementation 117 of FIG. 1 may be any type of experiment or test to assess the functionality of a software feature or to test other types of products or features. In some cases, the test implementation is an A/B test where one type of software functionality (e.g., type A) is tested against another type of software functionality (e.g., type B)). In such cases, the functionality of type A is often a baseline or existing type of functionality, while type B is a new feature or an updated feature or a variant on an existing feature. The updated feature introduces new functionality that adds a new ability, for example, or adds a new setting, or changes a user interface (UI) feature, or changes functionality in some form. The test executing module 113 then compares the new or updated feature against the existing baseline version. Many different test outcomes (e.g., outcomes A, B, or C (118-120)) are possible. For instance, in one embodiment, outcome A (118) indicates that a new feature in an A/B test leads to more user interaction with a software application. Outcome B (119) indicates that the new feature leads to less user interaction, and outcome C (120) indicates that the new feature does not statistically affect use of the software application. Other outcomes and test types are contemplated by the test implementation 117.

To produce these outcomes, the data accessing module 107 accesses data 116 that is to be used in conjunction with the test implementation 117. This data 116 includes stored data stored in a data store 122, as well as data from users (e.g., 115), or from other computer systems. In addition to input data used in the test implementation 117, the data 116 may also include output data that is generated by the test implementation 117. The test implementation 117 uses one or more different testing algorithms 121 to generate the output data using the various sources of input data. After the determining module 108 determines that the test implementation 117 is to be carried out using specific testing algorithms 121 that test for the various potential outcomes at step 220, the identifying module 109 identifies portions of the accessed data 116 that are to be used in the testing algorithms 121 at step 230.

As a result of performing step 230, the computer system 101 is aware of the testing algorithms 121 that are to be used in the test implementation 117 and is aware of the data 116 that are to be used with those testing algorithms. This specific combination of testing data 116 and testing algorithms 121 leads to a subset of identified data 110 that is to be used in the test implementation 117. After the data for the test implementation 117 has been identified, the data compressing module 111 then removes, at step 240, the testing data 116 that is not used by the specific testing algorithms 121 in the test implementation 117. In some cases, the data compressing module 111 also reduces the amount of data (or the data size) of the compressed data 112.

The test executing module 113 then executes the test implementation 117 using the specified testing algorithms 121 with the compressed data 112, at step 250. In this manner, the test executing module 113 is able to execute the test implementation 117 using a greatly reduced amount of data that only includes the data actually used by the testing algorithms 121 of the specific test implementation 117, in a compressed form. This allows the data used in the test implementation 117 to be executed using much less memory, and many fewer CPU cycles. In some cases, using the embodiments described herein, test implementations that were previously run on multiple distributed computing systems and still took many hours or even days to complete, can now be run on a single (non-distributed) computer system in 5-15 minutes. These embodiments will be described with specific reference to FIGS. 3-10 and with continued reference to computing environment 100 of FIG. 1.

Many entities run large-scale A/B tests (and other types of tests) to assess whether their ideas for changes to existing products or whether their ideas for new products will have the results they are expecting. Some experiments are designed to improve the quality of experience (QoE) for a given software application (e.g., a video streaming application). The computer system 101 measures quality of experience, for example, with a compilation of metrics that describe different aspects of a user's experience with the application from the time the user presses play until the time the user finishes watching the streaming program. Examples of such metrics include a measure of how quickly the content starts playing and the number of times the video needed to rebuffer during playback.

In some embodiments, experimenters design tests to analyze the effect of various decisions made for a given product. This effect may be the overall effect on end users, or the trend in the effect over time, referred to herein as a "dynamic treatment effect" or simply "treatment effect." In one example, experimenters send email messages, push notifications, or other electronic messages to promote new content. In this example, the experimenters want to know how effective those messages are in general (e.g., do end users that see push notifications for a certain show watch more or less of that show?) or, more specifically, whether those messages become more effective or less effective over time. Knowing this information helps the experimenters to know the best timing window to promote a launch. Such test implementations analyze a longitudinal dataset over time. This is a computationally difficult task, as the test implementation incorporates information indicating how much each user engages with the product each day.

As such, in this example, if there are one million end users and the test implementation is configured to check engagement for the next 10 days, the amount of data is amplified ten times the traditional (aggregate, non-user-specific) amount. The data compression techniques described herein reduce the amount of data needed to perform the dynamic treatment effect analysis and (at least in some cases) without any loss from data compression. The compression algorithms are designed to remove any data not used in a given set of calculations and are optimized for the balanced longitudinal dataset. These compression algorithms thus work specifically with balanced datasets, reducing data repetition and ultimately data quantity or volume. Mathematical formulae and algorithms described below compute a clustered covariance matrix, even with this reduction in data.

In one example, a software code developer creates more efficient encodes that provide improvements for low-bandwidth users that are subject to lower quality video. In this example, the software developer wants to understand whether the new code provides a meaningful improvement for users with low video quality, or whether the A/B test results were the result of noise. Such meaningful improvements are ascertainable using resampling techniques for quantifying statistical significance. These resampling techniques, as will be explained further below, do not merely show mean and median values to evaluate how well the new encodes are working for the users. These techniques also enable the software developer to understand movements in different parts of each metric's distribution. In most cases, the embodiments described herein are configured to precompute the results for many hundreds or thousands of streaming experiments, across multiple segments of users, and across multiple metrics. To perform this precomputing, the data compression techniques described herein bucket the data into different bins, reducing the volume of the data by 1,000 times or more. As noted above, this compression allows the computer system (e.g., 101) to compute statistics in only a few seconds, while maintaining very precise results.

In one example, a user is watching a streaming video program on a train or in a car. Although the user knows their internet connection may be spotty, the user still will tend to expect a high-quality experience, with relatively little or no buffering. One embodiment for testing metrics that measure quality of experience is referred to as a "quantile bootstrap." This quantile bootstrap is designed to provide a solution for understanding movement in certain parts of a metric distribution. One method quantile bootstrapping is designed to understand movement in each part of the metric distribution. Oftentimes, software developers or data scientists are not simply attempting to move the mean or median of a metric. For instance, when software developers release a new encoding scheme that is more efficient, one purpose for the new encoding scheme is to improve video quality for streaming users who have low video quality (e.g., while watching video on a train). The software developers want to evaluate whether the new code moved the lower tail of the video quality distribution, and whether the movement was statistically significant or whether the movement was simply due to noise.

Figure 3:
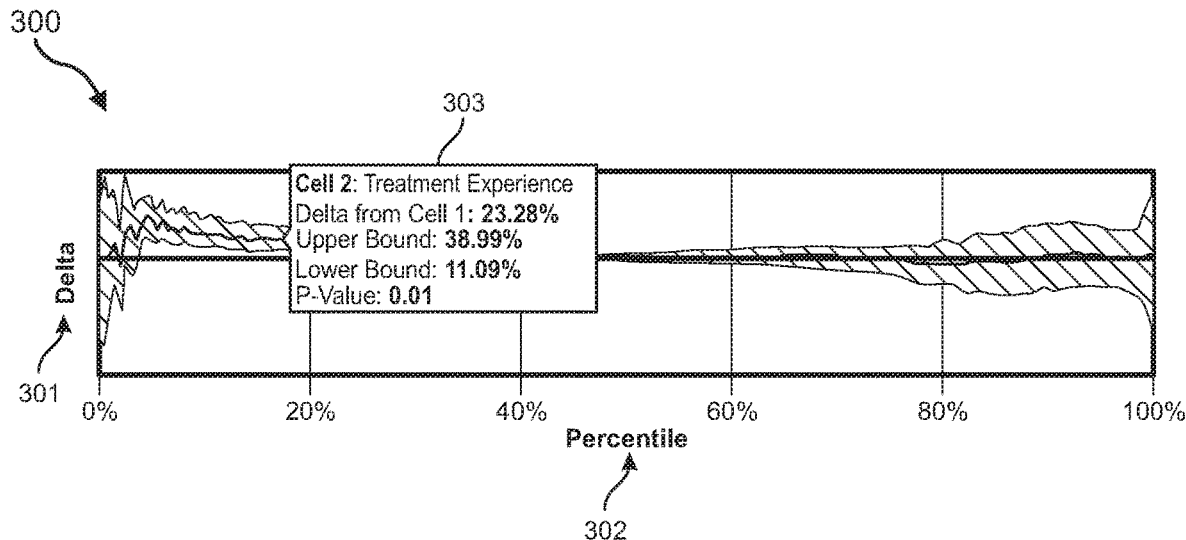
FIG. 3 illustrates a diagram of differences in video quality between a production experience and a treatment experience during a test implementation.

In some embodiments, the computer system 101 of FIG. 1 generates plots to quantify whether specific sections of a given distribution within the test implementation 117 were moved. The computer system 101 compares quantile functions and differences in quantile functions between treatment and/or production experiences. These plots help experimenters such as data scientists to assess the magnitude of the difference between test experiences for various quantiles within the metric distribution, and also help software developers to understand the improvements in perceptual video quality for users who experience the worst video quality. To measure statistical significance, the computer system 101 uses a bootstrapping procedure to create confidence intervals and p-values for specified quantiles (with adjustments to account for multiple comparisons). If the p-values for the quantiles of interest are relatively small, the software developers can be assured that the newly developed encodes do, in fact, improve quality in the treatment experience. In other words, the improvement in this example is statistically significant and is not random. This is illustrated in FIG. 3, where the difference plot 300 shows shaded confidence intervals 303 that demonstrate a statistically significant increase in video quality at the lowest percentiles of the distribution, with the delta values 301 shown on the y-axis, and the percentile 302 on the x-axis.

In streaming and in other types of experiments, those performing the experiments often watch for changes in the frequency of very rare events. One such example in the field of data streaming is the number of rebuffers per hour, as each rebuffer event potentially interrupts the users' playback experiences. Some experiments are designed to evaluate whether a given change to software code has reduced or increased the number of rebuffers per hour. To identify differences in metrics that occur very rarely, the embodiments described herein implement methods referred to as "rare event bootstraps." The rare event bootstrapping method leverages user-level aggregate data, which correspond to the level of randomization in these example test implementations. Summary statistics such as means and medians may be unsatisfactory and may not indicate the true effectiveness of a software change. For example, if a user streamed a program for a very short period of time, a metric such as rebuffers per hour would identify an extremely large outlier value because the denominator in the metric would be very small. Since these metrics occur relatively infrequently, their data distribution over different users would consist of almost all zero values and a small fraction of non-zero values. This makes a standard nonparametric Mann-Whitney U test less efficient as well.

To eliminate these issues, the embodiments described herein include techniques that compare rates of the control experience to each treatment experience. Unlike in the quantile bootstrap example above, where the computer system implements "one vote per user," in this example, the computer system weighs each hour (or other time block), or each session equally. The computer system 101 performs this weighting by summing the rebuffers across the user accounts, summing the total number of hours of content viewed across the user accounts, and then dividing the two for both the production and treatment experience.

Figure 4:
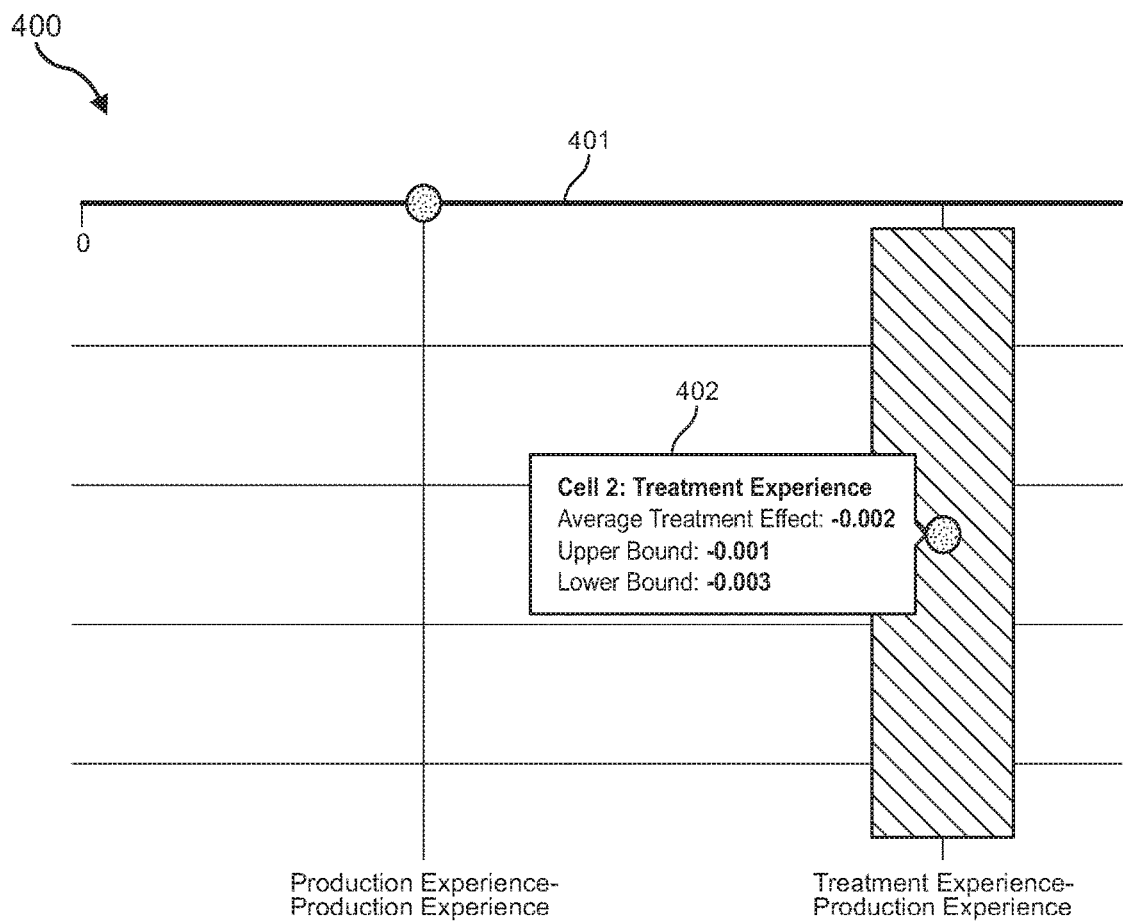
FIG. 4 illustrates a diagram of differences in rebuffer rate between a production experience and a treatment experience during a test implementation.
Figure 5:
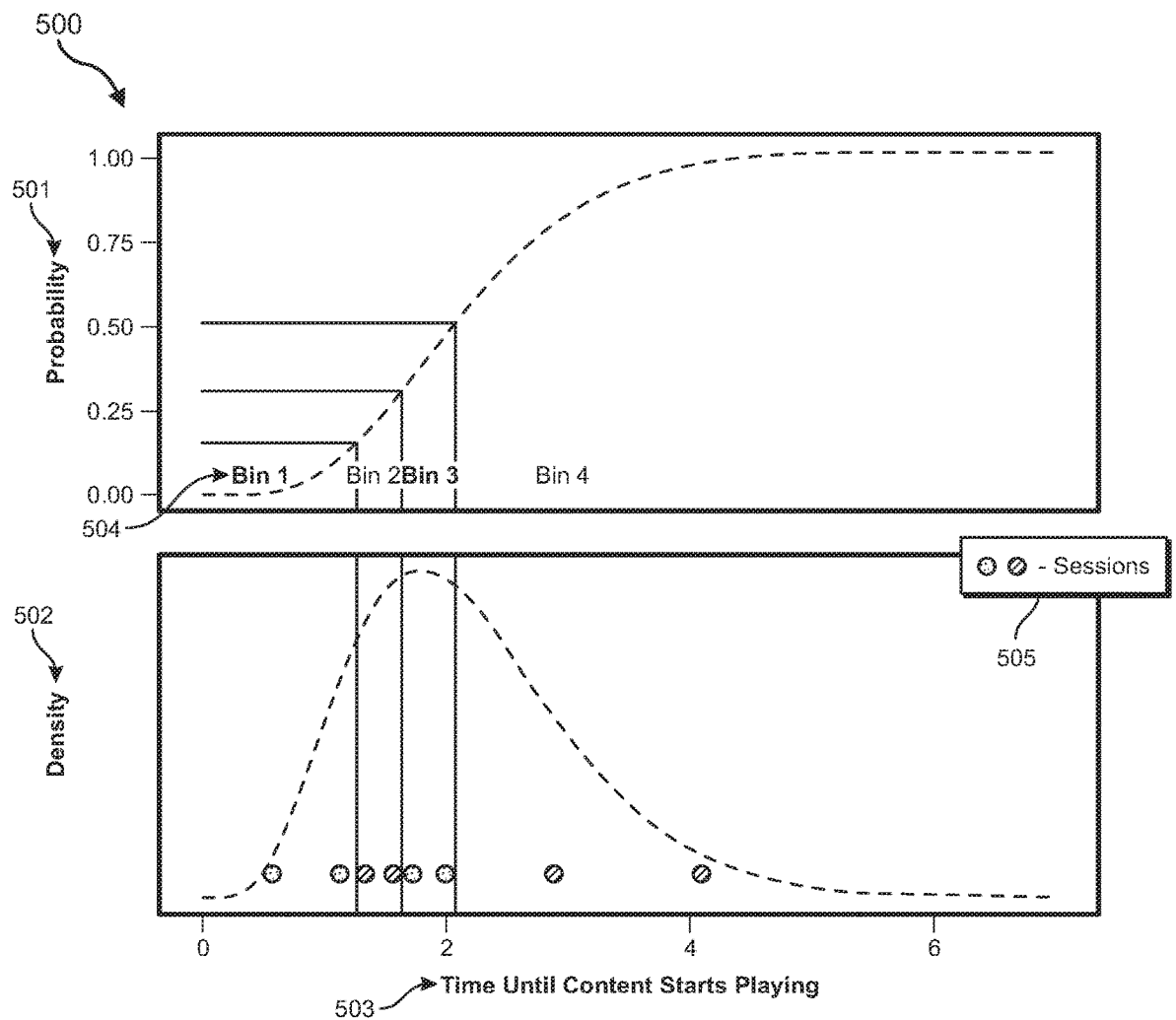
FIG. 5 illustrates an embodiment in which test results for different bins are illustrated over time.
Figure 6:
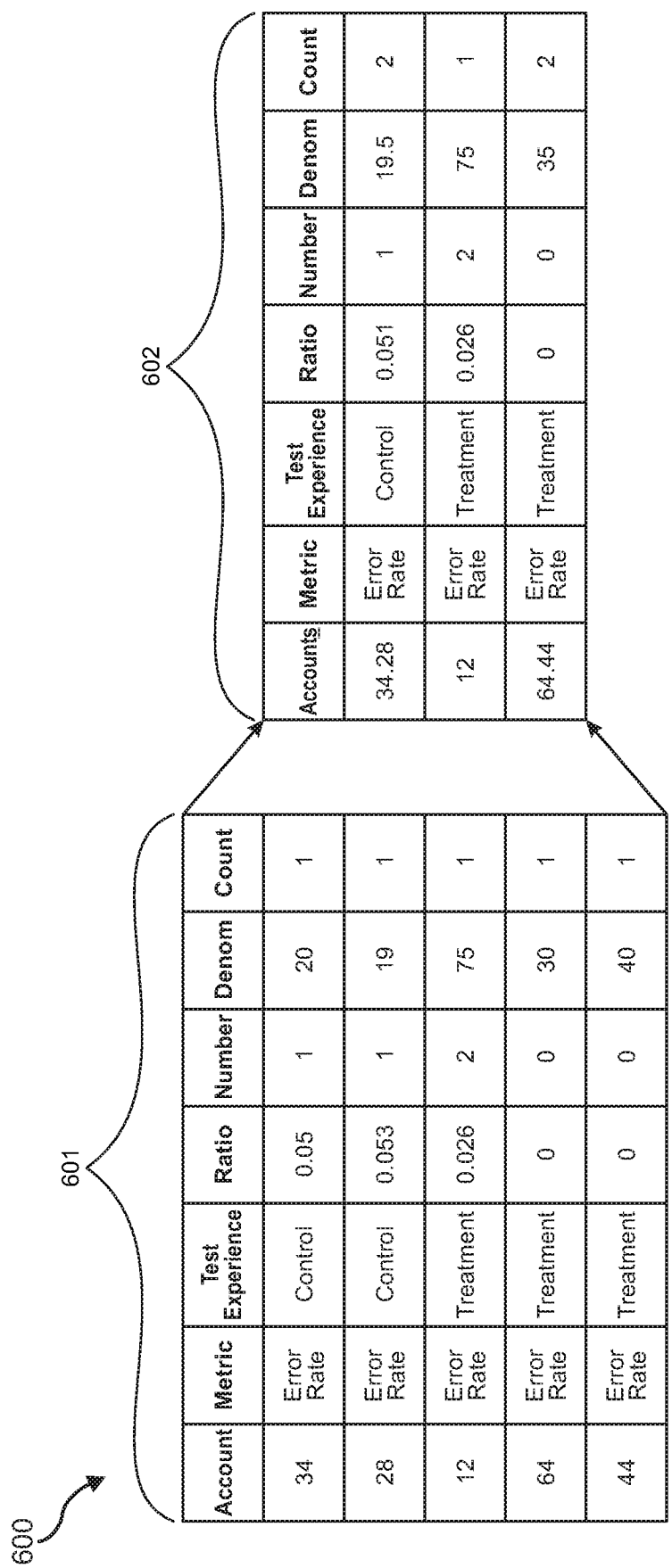
FIG. 6 illustrates an embodiment of a chart in which data sets are compressed using n-tile bucketing.

To assess whether the determined difference is statistically significant (i.e. meaningfully different), the computer system quantifies the uncertainty around point estimates. The computer system 101 bootstraps (i.e., resamples the data with replacement data) the users to generate new datasets in order to derive confidence intervals and compute p-values. At least in some cases, when resampling the data, the system resamples a two-vector pair (e.g. user-level viewing hours and rebuffers) to maintain the user-level information for this level of randomization. Resampling the user's ratio of rebuffers per hour may lose information about the viewing hours. For example, zero rebuffers in one second versus two rebuffers in two hours are very different user experiences. Traditional systems would only resample the ratio, and both of these values would have been zero; as such, traditional systems would not maintain meaningful differences between them. However, in the embodiments described herein, the weighing and quantile bootstrap methods provide a substantially complete view of the QoE metric movements in an A/B test. FIG. 4 provides an example of this in chart 400, which illustrates the difference in rebuffer rate between the production experience 401 and the treatment experience 402, in which the treatment experience provides a statistically significant reduction in rebuffer rate.

In at least some embodiments, these bootstrapping methods are scaled to power multiple different streaming QoE test implementations by precomputing results for some or all of the tests, on some or all QoE metrics, and on some or all commonly compared segments of the population (e.g. for all device types in the test). To do so, the data compressing module 111 of computer system 101, for example, reduces the total number of rows in the dataset while maintaining accurate results compared to using the full dataset. One embodiment implements an n-tile bucketing approach. This n-tile bucketing approach implements a process that includes 1) Sorting the data from smallest to largest value, 2) Splitting the data into evenly sized buckets, 3) Taking a summary statistic for each bucket (e.g. the mean or the median), and 4) Consolidating some or all of the rows from a single bucket into one row, keeping track only of the summary statistic and the total number of original rows that were consolidated (i.e., the 'count'). Now the total number of rows in the dataset equals the number of buckets, with an additional column indicating the number of original data points in that bucket.

For the "well behaved" metrics where the computer system is trying to understand movements in specific parts of the distribution, the computer system groups the original values into a fixed number of buckets. In these embodiments, "well behaved" refers to metrics whose quantiles provide meaningful information (e.g., metrics are not "well behaved" if they take the value zero nearly all the time and, as such, most quantiles would be zero). For example, in chart 500 of FIG. 5, the data are placed into bins 1-4, and are arranged according to probability 501 and density 502 along the y-axis (each session 505 being shown with different shading), and according to the time expired until the content starts playing 503 on the x-axis. The number of buckets becomes the number of rows in the compressed dataset. When extending to metrics that occur rarely (like rebuffers per hour), the system maintains an approximation of the relationship between the numerator and the denominator. In some cases, N-tiling the metric value itself (i.e. the ratio) will result in loss of information about the absolute scale. As such, in this example, the system only applies the n-tiling compressing approach to the denominator. Because metrics in this class are, by definition, rare, the number of unique numerator values is small. Take rebuffers per hour, for example, where the number of rebuffers a user has (the numerator) is usually zero (see 504), and a few users may have 1-5 rebuffers. The number of unique values the numerator can take is typically no more than 100. In this manner, the same compression mechanism is used for both quantile and rare event bootstrapping, where the quantile bootstrap solution is a simpler special case of the two-dimensional compression. This is illustrated in chart 600 of FIG. 6, which shows an example of how an uncompressed dataset (601) reduces down to a compressed dataset (602) through n-tile bucketing.

In some cases, the computer system 101 uses different evaluation criteria to identify the optimal number of buckets to use in any given test implementation 117. These criteria may include, without limitation, the mean absolute difference in p-values between using the full and compressed datasets, the mean absolute difference in estimates between using the full and compressed datasets, and the total number of p-values with agreement (both statistically significant or not) between using the full and compressed datasets. In some embodiments, the computer system 101 implements a specified number of buckets that provides an agreement in over 99.9 percent of p-values. Also, in at least some cases, the estimates and p-values for both bootstrapping techniques described above result in values that lie closely together. Using these compression techniques, the computer system 101 reduces the number of rows of the dataset by a factor of 1,000 or more while maintaining highly accurate results. Because the data used to run the tests is so highly reduced, the test algorithms 121 scale to power the analyses for multiple different simultaneous streaming experimentations. In addition to streaming experiments, this testing platform infrastructure may be incorporated into test implementations and reports from many other types of industries.

In some cases, the computer system 101 of FIG. 1 uses statistical modeling methods to deliver rich analyses of causal effects. Some of these analyses incorporate information gathered from different segments of users. Within a given product, for example, experimenters attempt to optimize artwork that best showcases the underlying video streaming content. For instance, the computer system 101 may determine that a given movie or television show should have artwork that emphasizes that the show is a thriller, or that the show is about kids, or that the show has nostalgic value. The computer system 101 also determines whether different artwork should be presented to different segments of users. For example, artwork that appeals to Americans that grew up in the 1980s may have a throwback feeling with an image that shows characters in costumes that were popular at the time and, as such, may pique the interest of users in that age range.

Analyzing different causal effects for different segments of users is referred to herein as identifying heterogeneous treatment effects. This, as noted above, is often difficult to compute in a large engineering system. Instead of analyzing the overall causal effect due to the artwork, which is a single number, the embodiments described herein analyze a causal effect per segment of users. Analyzing data from multiple different segments of users easily overwhelms traditional systems, which rely on distributed computing systems with large numbers of hardware processors. The embodiments described herein, in contrast, implement data compression techniques and mathematical formulae that are able to estimate hundreds of heterogeneous effects in a matter of seconds. This allows the experimenters to understand different segments of users and inform business strategies. Furthermore, data compression reduces the volume of data to such an extent that users of these techniques may compute heterogeneous effects on a single computer system (e.g., a laptop or desktop PC), and do not need distributed (e.g., cloud) computing. As such, implementing the embodiments described herein is much less costly and can be run by a single person, as opposed to traditional techniques that require a diverse team of cloud operations specialists to manage.

Many traditional test implementations and experiments suffer from challenges in measuring treatment effects. For example, metrics that are being tracked by an experimentation platform (XP) are often underpowered due to small treatment effects or due to large amounts of noise. Experimentation platforms that use simple statistical tests such as the two-sample t test, or the proportions test, are especially vulnerable to this. Experimenters are interested in different variants of the treatment effect. The average treatment effect (ATE) is used to summarize the performance of the treatment overall. The conditional average treatment effect (CATE) measures the treatment effect for a specific subpopulation. Identifying this heterogeneity in treatment effects is helpful in producing a product that is personalized for its users. Dynamic treatment effects (DTE) measure the treatment effect through time, and are a core element to forecasting the effect of a given change in a software application over long periods of time.

To achieve stronger analytical abilities, engineering teams that build online experimentation platforms implement the systems described herein that span both platform engineering and the science of causal inference. These experimentation platforms: 1) use data to estimate statistical models that go beyond two-sample t tests and proportions test, 2) compute causal effects, 3) receive and respond to live queries to analyze different subpopulations or variants of treatment effects, and 4) run at scale.

The embodiments described herein implement various principles from the field of Computational Causal Inference. Accordingly, at least some of the embodiments herein focus on how a multidisciplinary team structures an engineering system so that it is general and future-proof and allows causal inference researchers to iterate on classes of models, forms of the model, and forms of the variance. The embodiments described herein outline how this is achieved in a scalable way that allows the engineering system to respond to live analysis queries in seconds. As noted above, many of these implementations of statistical models are performant enough to run on a single laptop and still serve large experimentation platforms with very large numbers of users (e.g., thousands or millions of users). At least some implementations of these models are coded in programming languages that allow causal inference researchers to iterate even faster (e.g., written in C++, with interfaces written in Python and R).

Computational Causal Inference (CompCI), as the term is used herein, refers to an interdisciplinary field that includes causal inference, algorithms design, and numerical computing. CompCI methods make causal inference more scalable, programmatic, and accessible. At least some of the CompCI embodiments described herein provide numerical methods and software optimized for causal inference that can analyze massive datasets with a variety of different causal effects in a generic and efficient way. These CompCI embodiments provide research agility as well as software implementations that are configured to function as the backend for larger engineering systems that are based on the analysis of causal effects.

In at least some embodiments, CompCI methods are designed to reduce conflict between novel research and practical implementations and further to improve research speed. Traditional systems and past methods of research have attempted to improve the analysis of causal effects, but engineering teams would be bottlenecked in implementation due to challenges in scalability. In causal inference, the underlying system runs through multiple counterfactual simulations, asking, for example, "What if the system had used treatment X?" The challenges are amplified multiple times when looking at multiple metrics, across multiple segments, over multiple time periods, across multiple experiments.

The CompCI embodiments described herein, owing to improved scalability, are able to run Covariate Adjustment, Heterogeneous Treatment Effects (HTE), Weighted Least Squares, Quantile Regression, Quantile Bootstrap, and/or Dynamic Treatment Effects (DTE). These improvements create improved statistical power in treatment effects, faster turn-around times for analysis, analysis for data that is not well-behaved, and deeper analyses into treatment effects for different segments of users and for different periods of time. The CompCI embodiments provide these improvements by making massive computations feasible, both by reducing the memory footprint of the algorithms used in the test implementations (e.g., 117 of FIG. 1) as well as reducing latency involved in the computations. At least some of the CompCI algorithms described herein run over 100× faster than traditional test implementation solutions. Indeed, increased scalability allows experimenters to analyze tests on a single computer system, including analyzing experimentation data for heterogeneous effects, dynamic effects, and quantile effects.

In some cases, CompCI embodiments increase the amount of insight experimenters get from experiments through two transformations: 1) transitioning from average effects to Heterogeneous Treatment Effects (HTE), where average effects report one set of numbers for each cell and HTE reports a set of numbers for each segment of users for each cell, and 2) transitioning from HTE to Dynamic Treatment Effects (DTE). This reports a set of numbers for each segment of users for each unit of time for each cell, and allows experimenters to see trends in treatment effects.

In some cases, the CompCI embodiments described herein increase the effectiveness of researchers by providing them software that can estimate causal effects models efficiently, and can integrate the causal effects models into large engineering systems. This can be challenging when algorithms for causal effects need to fit a model, condition on context and possible actions to take, score the response variable, and compute differences between counterfactuals. Such computation may greatly increase in volume and may become overwhelming when the computation is performed with large datasets, with high dimensional features, with many possible actions to choose from, and with many responses. The embodiments described herein provide broad software integration of causal effects models.

Computational causal inference brings a software implementation focus to causal inference, especially with respect to high performance numerical computing. The CompCI systems described herein implement several algorithms to be highly performant, while still maintaining a low memory footprint. For example, one experimentation platform may pivot away from two sample t tests to models that estimate average effects, heterogeneous effects, and time-dynamic treatment effects. These effects help the experimenters understand the user base, different segments in the user base, and whether there are trends in segments over time. The CompCI systems also take advantage of user covariates throughout these models in order to increase statistical power. While this analysis may help to inform business strategy, the volume of the data may involve large amounts of memory, and the estimation of the causal effects on such volume of data is computationally heavy.

In the past, the computations for covariate adjusted heterogeneous effects and time-dynamic effects were slow, memory heavy, hard to debug, a large source of engineering risk, and ultimately could not scale to many large experiments. Using optimizations from CompCI, the embodiments described herein embodiments estimate hundreds of conditional average effects on a dataset with, for example, 10 million observations in 10 seconds, on a single computer system. In another example, these CompCI systems may analyze 500 million observations with 10,000 features on a single computer system. To achieve this, the CompCI systems leverage a software stack that is optimized for sparse linear algebra, a lossless data compression strategy that reduces data volume, and provides mathematical formulae that are optimized specifically for estimating causal effects. These CompCI systems also optimize for memory and data alignment. Potential advantages of CompCI systems include the ability to scale complex models and deliver rich insights for experimenters, the ability to analyze large datasets for causal effects in seconds, thereby increasing research agility, the ability to analyze data on a single computer system which greatly simplifies debugging, and scalability which makes computation for large engineering systems tractable, reducing engineering risk.

Figure 7A:
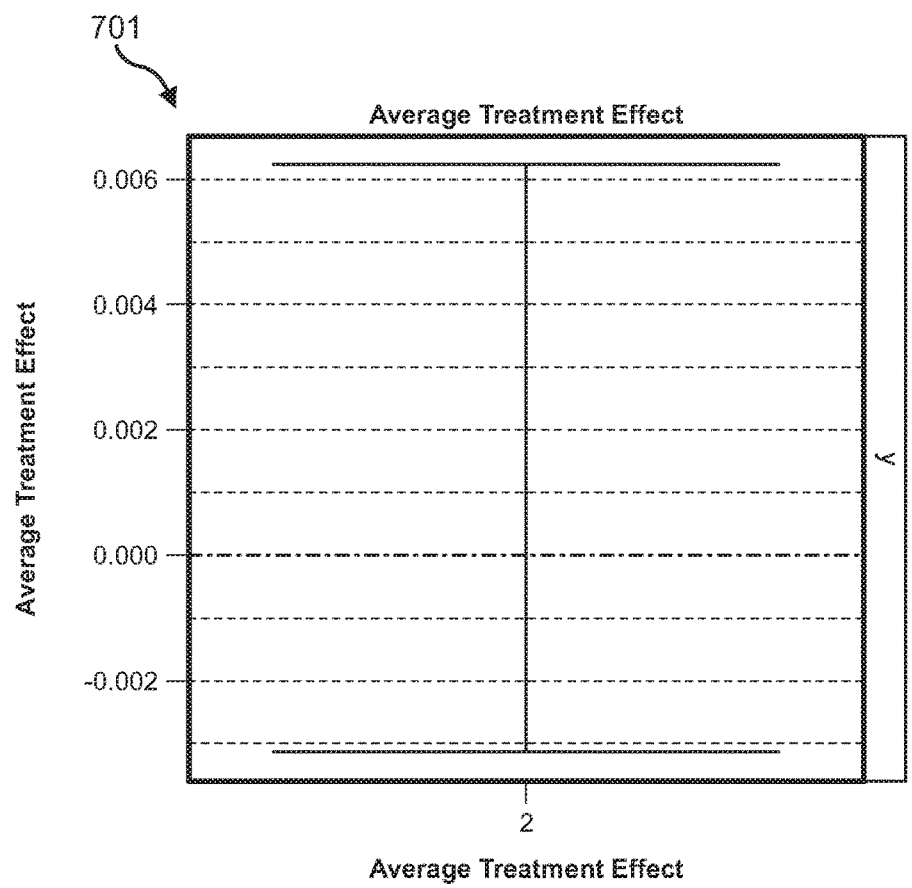
FIGS. 7A-7C illustrate embodiments of various types of treatment effects including average treatment effects, conditional average treatment effects, and temporal treatment effects.
Figure 7B:
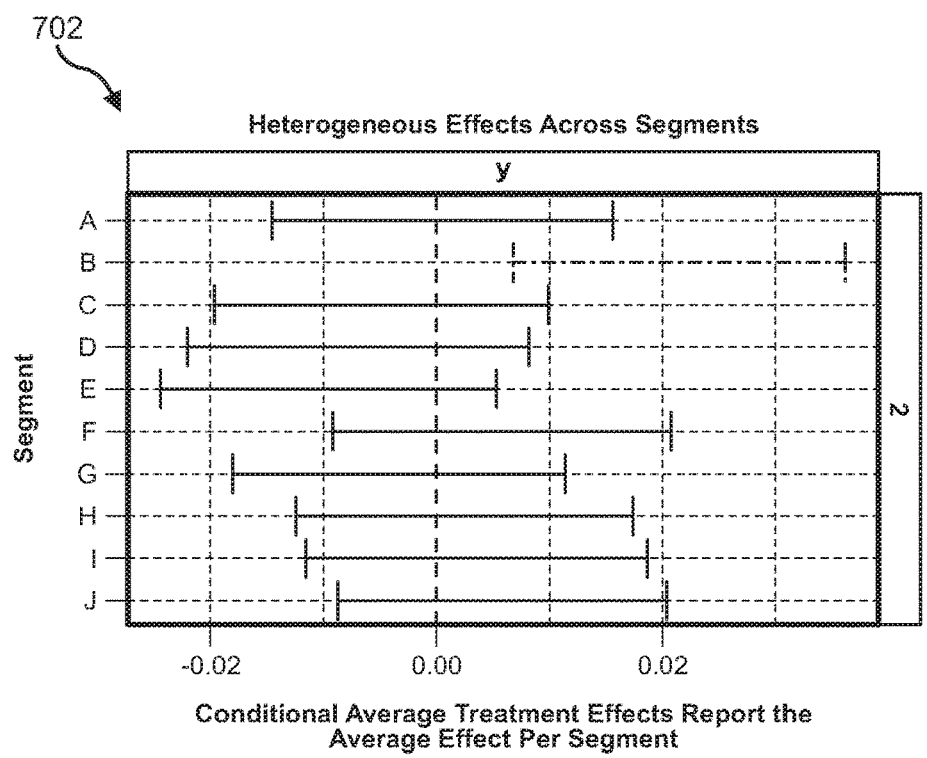
Figure 7C:
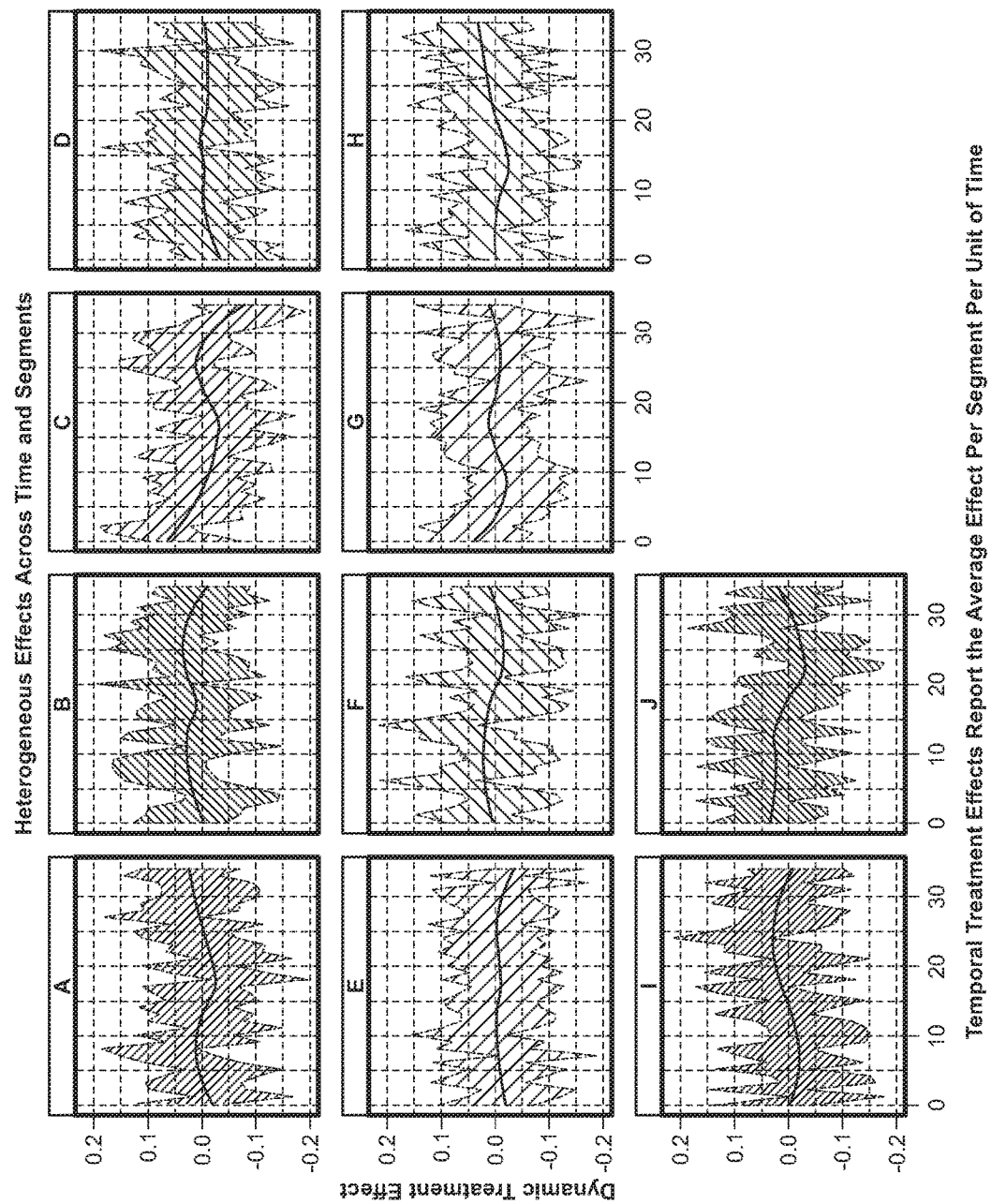

There are various classes of engineering systems that motivate the need for performant computation for causal effects: experimentation platforms, and algorithmic policy making engines. An experimentation platform (XP) that reports on multiple online and controlled experiments is designed to estimate causal effects at scale. For each experiment, an XP models a variety of causal effects. For example, the XP models the common average treatment effect, the conditional average treatment effects, and/or the temporal treatment effects, seen in FIG. 1. These effects may help the business understand its user base, different segments in the user base, and how they change over time. The volume of the data demands large amounts of memory, and the estimation of the treatment effects on such volume of data is computationally heavy. FIGS. 7A-7C illustrate example embodiments of such treatment effects. Chart 701 in FIG. 7A, for example, illustrates an average treatment effect. Chart 702 of FIG. 7B illustrates an example in which conditional average treatment effects report the average effect per segment. And, chart 703 of FIG. 7C illustrates an embodiment in which temporal treatment effects report the average effect per segment per unit of time.

In some cases, such treatment effects are measured using Ordinary Least Squares (OLS). OLS also extends into conditional average effects and dynamic effects. In one example, the first step involves fitting OLS, and the second step is to query it for counterfactual predictions across some or all potential outcomes. The computational complexity for fitting OLS is $O(np^2)$, where n is the number of observations, and p is the number of features. In practice, an experimentation platform may encounter scenarios where n is on the order of $10^8$. The OLS model implements interaction terms in order to estimate conditional average treatment effects, making p, in this case, very large. To measure treatment effects over time, the systems herein observe each user repeatedly for multiple time periods, dramatically increasing the number of observations in the analysis. In one example, an analysis of causal effects that takes $n=10^8$ observations then becomes an analysis that takes $n=3\times10^9$ or $n=9\times10^9$ observations. After fitting such a large OLS model with covariates, the system evaluates the model for different potential outcomes (e.g., 118-120 of FIG. 1).

For each conditional difference, the expectation scores the counterfactual feature matrix of a given size (e.g., n×p). Generating these counterfactual feature matrices and predictions may be a memory and computationally heavy operation. An experimentation platform repeats this exercise for multiple dependent variables and for multiple experiments. In at least some embodiments, policy algorithms support engineering systems through automated decision making. In such cases, the policy algorithms make these decisions automatically by recommending actions that cause the system to incrementally reach a better state at each iteration. Such decision making may be applied in product recommendations, in artwork, and in other fields. In at least some policy algorithms, the system establishes n users, and, for each user, the system makes a choice among K actions in A={A1, A2, ..., AK}. Each user has features, x, and each action generates a reward, R(A), which may be a function of x. The policy, π, is the recommended action for a user, and can also be a function of x.

Given a current policy, the computer system (e.g., computer system 101 of FIG. 1) attempts to determine whether there are alternate policies that achieve a larger reward than can be identified as a treatment effect. In some examples, the computer system pursues this as a causal effects problem. Causal effects problems overlap with policy algorithms in one or more of the following ways: 1) identifying the best action involves measuring treatment effects, 2) personalized policies seek to identify segments whose treatment effect is significantly different from others (e.g., in FIG. 7B, the system may seek a personalized policy for segment B in chart 702), 3) policy makers are interested in how actions affect subpopulations or subgroups of users differently, 4) in at least some cases, the effect of the policy is a function of time, and may be a function of the actions previously taken (this is similar to analyzing the causal effects of digital ads, which vary in time and have compounding or diminishing effects), 5) a policy algorithm suggests an action π*(x). However, the action that is taken is, in some cases, a different action, or no action at all (which is a case of noncompliance—in order to correctly model the treatment effect, the computer system normalizes by the probability of taking the suggested action), and 6) a policy algorithm typically assumes that all n users are allowed to take any of the actions in A. However, some users are not qualified to take certain actions. Furthermore, the list of actions the users are qualified for often changes over time, which may be similar to modeling causal effects for an at-risk group.

In order to estimate personalized policies using causal effects, the system (e.g., computer system 101 of FIG. 1) first fits a causal model. Then, the system queries the causal model across some or all possible actions to predict individual treatment effects conditioning on a user's features. This, in at least some cases, is similar to implementations in an experimentation platform, with the exception that an experimentation platform analyzes causal effects retrospectively, and policy algorithms predict causal effects prospectively. Policy algorithms naturally inherit some or all of the computational complexity that experimentation platforms have. Furthermore, the search space to predict the best action for each user demands the distribution of the nK possible conditional treatment effects, which may be, in some cases, prohibitive to estimate. Since policy algorithms apply a blend of different treatments to different users, the evaluation of the policy is different than the evaluation of a single treatment in an experimentation platform, and is computationally more complex.

In at least some embodiments, computational causal inference's focus on numerical computing provides agility that enables users to innovate, be productive, and quickly recover from mistakes. This focus in CompCI simultaneously serves both the engineering needs in various industries as well as the needs to iterate quickly in research. The embodiments described herein may be leveraged to assess new industry engineering systems for risk and for their ability to scale before they are deployed. Sustaining an engineering system is a long-term commitment and, as such, the experimentation platform is capable of continuously scaling with the various industries for many years. In some cases, these industries consider various costs including: 1) instability or latency in the product for the end consumers, 2) the risk that scaling becomes too expensive in terms of money, hardware, and/or time, and will require a significant redesign in the future (this may include the redesign of other engineering services in a given ecosystem), and/or 3) the associated loss in industry productivity due to managing such large computations.

Alternatively, these industrial entities may create more scalable, but nuanced, approximations that deviate from rigorous mathematical frameworks in causal inference. Such deviations may create potential challenges in traditional systems, where it becomes difficult to extend, and hard to absorb new innovations from the causal inference field. The CompCI embodiments described herein preempt such scalability challenges by optimizing the numerical algorithms for causal effects, thereby reducing the risk in developing and maintaining engineering systems that are based on causal inference. Secondly, these CompCI embodiments allow failed tasks to be restarted and rerun quickly, improving developer operations and maintainability of the system.

Fast computing helps researchers become productive and innovative. First, fast or interactive computing maximizes cognitive flow. Scalable computation that runs on a single machine removes the cognitive overhead of managing distributed environments. Attention becomes concentrated on a single machine or computer system that returns results in seconds, facilitating a two-way communication between the researcher and the data. This helps the researcher transform thought into software code and results into new thoughts, ultimately improving productivity. Second, fast computing empowers researchers to innovate by making failure less costly. Innovations are typically preceded by a long series of failures, which may be both mentally and emotionally taxing. The challenges to success can be exacerbated when iterations take hours instead of seconds. Fast-computing software not only saves time for the researcher, the fast-computing software provides easier recovery from mistakes, lowering psychological barriers to innovation and amplifying the researcher's determination. Finally, transferring research into business applications has less friction when academic research and enterprise engineering systems use the same software stack, which is relatively simple to iterate on and runs computationally large problems on a single computer system. As such, the fast-computing software provides powerful productivity gains for experimentation platforms and for algorithmic policy making.

Many current systems, including those that use ordinary least squares (OLS) or certain types of arrays to represent dense matrices are only effectively run on large-scale distributed systems. These traditional systems implement data structures that are dense and are optimized for dense linear algebra. In contrast, the embodiments described herein implement methods that are optimized for sparse linear algebra, which run effectively using much less data and many fewer computations. In some embodiments, for example, traditional systems would compute the difference in counterfactuals by naively constructing a specified number of counterfactual matrices (e.g., two counterfactual matrices). In these two matrices in this example, the traditional system would set the treatment variable to a specific value and, as such, the treatment effect would be the difference in the predicted counterfactual outcome. If there are a specified number of actions to evaluate (e.g., K actions), there would be K counterfactual matrices to generate, some or all of which would be dense matrices and would suffer from inefficient storage and dense linear algebra. With such constraints these traditional implementations would require large amounts of computing resources to use linear models to iterate and find treatment effect heterogeneity. For example, on a problem with n=107 observations, p=200 features, a dense linear algebra solver would spend 30 minutes to compute 1,000 CATEs. Traditional two-stage least squares models and generalized random forests are similarly only feasible when run on large, distributed computing systems. For instance, in practice, evaluating causal effects with K treatments and m KPIs requires K·m calls to a generalized random forest. A single call to the generalized random forest using a problem with n=2·10$^6$, p=10 and the number of trees=4,000 would take approximately two hours to fit the ensemble using 32 active processing cores.

In order to provide faster processing, the computational causal inference embodiments described herein provide a generalized framework for computing different causal effects from different models, then provide optimizations to that framework. Some of the CompCI embodiments described herein use the potential outcomes framework to measure treatment effects. First, the CompCI system assumes a model for the relationship between a key performance indicator (KPI), y, a treatment variable, A, and other exogenous features, X. For simplicity, the CompCI system will let A be a binary indicator variable, where A=1 represents a user receiving the treatment experience, and A=0 for the control experience. The CompCI system estimates the difference between providing the treatment experience to the user, and not providing the treatment experience (e.g., outcomes tested in an A/B test), by taking the difference in conditional expectations.

If a model, y=f(A, X), has already been fit, then this definition for the conditional treatment effect is computationally simpler to generalize. However, experimenting across many models may remain computationally difficult. Various models may be used to estimate E[y|A, X]. Each model has different requirements for the input data, each has different options, each has a different estimation strategy, and each has a different integration strategy into engineering systems. The CompCI system generalizes a software framework beyond the potential outcomes framework. For example, software can democratize and provide programmatic access across many models including design patterns in machine learning (ML) frameworks. First, these frameworks have several built-in models, but also expose an API to define an arbitrary model as the minimization of a cost function. The ML frameworks then apply generic numerical optimization functions to these arbitrary models. One example implementation provides relatively simple and composable code that allows end users to specify the form of a model, and then train the model without needing to derive an estimation strategy.

This relative simplicity makes integration with other engineering systems seamless. Deploying a change to the form of the model automatically changes the estimation strategy and predictions on new features, and is a single point of change for a developer. The CompCI systems described herein implement software that generalizes the software framing of causal inference problems, creates a structured framework for computing causal effects, and makes software deployment simple. Specified model frameworks simplify the process of training an arbitrary model. After a model is trained, the conditional treatment effect is the difference in conditional expectations comparing the treatment experience to the control experience. However, causal inference problems have two additional layers of complexity that demand a powerful software framework.

First, in at least some cases, there are conditions on when the conditional difference may be safely interpreted as a causal effect. For example, if the model is parameterized by a specified value, the difference may be written as a specific function where a causal effect is identified. In parametric models, a parameter is identified if it has an estimator that is consistent, and its convergence does not depend on other parameters. Identification is a property that varies by model, which can make it challenging for a framework to detect whether an arbitrary model has parameters that can be identified. In most cases, the identification involves declaring assumptions about the data generating process, which should be understandable to the framework in order to provide safe estimation of treatment effects. After determining a collection of models that have causal identification, the system then estimates the distribution of the treatment effect from an arbitrary model, which may be generically estimated through a bootstrap process. Together, arbitrary model training, safe identification of causal effects, the bootstrap, and the potential outcomes framework create a general framework for computing treatment effects that is leveraged in an experimentation platform and an algorithmic policy making engine.

In addition to providing a general framework for measuring causal effects, CompCI software methods are scalable and performant, allowing for easier integration into engineering systems. These CompCI software methods provide opportunities for sparse data optimization in the modeling stack. First, in at least one example, the CompCI system optimizes the creation of a feature matrix for sparse features using data. Second, the CompCI system optimizes model training for sparse algebra. Third, the CompCI system optimizes estimating the treatment effects for sparse algebra. The CompCI system frequently retrieves data from a data warehouse in the form of a data frame, which the system then encodes as a feature matrix. One optimization here is to convert data from warehouses directly into feature matrices, without constructing data frames. For example, parquet files are serialized with a specified format for columnar storage, and are aligned with columnar storage formats for matrices. Software that constructs a feature matrix from a parquet file, eliminating overhead from data frames, greatly reduces the amount of computing resources used.

In many cases, feature matrices contain multiple zeroes. This may be especially true when treatment variables contain categorical variables that are one-hot encoded. The software library creating a feature matrix is optimized so that the feature matrix is sparse, which decreases storage costs and improves subsequent modeling steps. After constructing the matrix, the CompCI system estimates the model with the matrix and optimizes any linear algebra operations as sparse linear algebra. For example, in some cases, the CompCI system achieves high performance computing for linear models using sparse feature matrices and sparse Cholesky decompositions in Eigen. The estimation of treatment effects through the difference in conditional expectations also optimizes for the creation of sparse feature matrices and sparse linear algebra. Because the difference in conditional expectations holds some or all variables constant, and only varies the treatment variable, the conditional difference is representable as operations on a sparse matrix.

Estimating conditional average treatment effects involves constructing counterfactual feature matrices to simulate the difference between treatment and control experiences. In some cases, the CompCI system leverages structure in linear models to estimate conditional average effects across multiple treatments. The CompCI system performs this leveraging without allocating memory for counterfactual matrices by reusing the model matrix that was initially used for training. In both applications for an experimentation platform and an algorithmic policy making engine, there may be multiple treatments to consider. In at least some cases, the experimenter desires to analyze the effect of each treatment and identify the optimal treatment. There may also be multiple key performance indicators that are used to determine the optimal treatment. The evaluation of many different treatment effects for many outcomes is, at least in some cases, performed in a vectorized way, where computational overhead is minimized and iteration over key performance indicators and causal effects involve minimal incremental computation. For example, OLS estimates a set of parameters by doing operations on a covariance matrix. This covariance matrix is then efficiently reused across multiple key performance indicators with minimal incremental computation.

In some cases, the CompCI system is configured to estimate the sampling distribution of treatment effects generically using the bootstrap. To do this at scale, the CompCI system implements multiple bootstraps, which provides an efficient way to compute the bootstrap by dividing the underlying data into multiple small partitions, and then bootstrapping within each partition. This bootstrapping method may be run in parallel and is scalable. Furthermore, the bootstrapping method is generic and may be applied to models without knowing specific properties a priori. By integrating into a general framework for measuring treatment effects, the multiple bootstraps become an engineering abstraction that allows developers to focus on causal identification and parameter estimation, without having to write specialized functions for estimating the distribution of treatment effects. In this manner, bootstrapping is a useful component in creating a simple and unified framework.

In general, memory allocations and deallocations often consume a significant amount of time in numerical computing. For example, computing the variance on a vector may involve the sum of the vector, and the sum of its squared elements. Allocating a vector to represent its squared elements is inefficient because the squared elements will be reduced through the sum function. Numerical algorithms design for the end target in mind, and minimize memory allocations. Conditional average treatment effects are described herein as the average treatment effect among a subset of users. This is computed by taking the subset of the feature matrix, computing counterfactual predictions, and then calculating the difference. To minimize memory allocations, the subset of the feature matrix avoids creation of a deep copy of the data; rather, the subset of the feature matrix includes a view of the original data.

In some cases, the CompCI system optimizes computations by making use of cache memory. One way of using cache memory is to load data so that the data is accessed sequentially, improving spatial locality. For example, when computing the treatment effect for a specific subpopulation where $X=x^*$, the CompCI system improves spatial locality by loading data that is sorted a priori so that users with $X=x^*$ are in consecutive memory blocks. These consecutive memory blocks are then quicker to access, leading to processing gains (e.g., reduced data access and processing times). Using the embodiments described above, the CompCI system may estimate treatment effects on large amounts of data in a manner that is 100 times or more performant than traditional libraries. In one example, a single computer system estimates 1,000 conditional average effects with $n=5 \cdot 10^7$ and $p \approx 200$ in approximately 10 seconds. In an extremely large problem with $n=5 \cdot 10^8$ and $p \approx 10,000$, a single computer system computes conditional temporal treatment effects in one hour using an autocorrelated model. Such short processing times make integrating research on heterogeneous treatment effects and temporal treatment effects into the XP more scalable and less risky. Furthermore, single-computer-system software for modeling simplifies engineering management in the experimentation platform, and creates an easier path for moving new research and new experiments onto experimentation platforms.

In some cases, the computer system 101 of FIG. 1 is itself or is configured to provide an experimentation platform. This experimentation platform may include the test executing module 113, the data store 122, the test implementation 117, and/or the testing algorithms 121. This experimentation platform is configured to provide a specific user experience, allowing the user (e.g., 115) to conduct experiments on new or updated software features. In one embodiment, user 115 logs into the experimentation platform and selects an experiment to analyze. The experimentation platform retrieves data 116 from a warehouse corresponding to the experiment (e.g., data store 122) and runs statistical tests on the fly. The experimentation platform displays results in a dashboard or other type of user interface. The user 115 interacts with the dashboard and analyzes different views of the data 116, which trigger the experimentation platform to pull new data and run subsequent statistical tests (e.g., 117). Thus, the experimentation platform provides interactivity for users, responding to live queries while the experiments are being carried out.

In controlled, randomized experiments, the experimentation platform attempts to answer a question: what would have happened if a specified treatment were applied to a user? In at least some embodiments, the counterfactual cannot be observed because the user cannot simultaneously experience both control and treatment. Through the experiment, the experimentation platform collects multiple samples in order to test for differences in the outcome distribution between control users and treatment users. By using a model to predict the counterfactual outcome, the experimentation platform expands the number of opportunities to test if the observed data was significantly different. Indeed, multiple statistical tests may be performed within a counterfactual scoring framework. Having this framework provides the experimentation platform a single, well designed computational strategy for measuring different treatment effects such as the average, conditional average, and dynamic treatment effects, as noted above in conjunction with the computational causal inference embodiments. At least some of the examples described below use Ordinary Least Squares (OLS) as an example for how counterfactual scoring provides a generic computational paradigm with extensions that encompass different types of treatment effects.

In one embodiment, the experimentation platform conducts a controlled, randomized experiment with exactly two experiences: the control experience and the treatment experience. The outcome of interest is indicated in one variable, with a specified number of total users, and specified numbers of users in the treatment group and in the control group. The average treatment effect (ATE) specifies a difference in the potential outcomes, and is estimated by sample averages. The difference in averages is a component of a two-sample t test which is used to determine if the means of the control and treatment groups differ. The two-sample t test can be extended and referred to as a model in this example as it is a special case of OLS. Continuing this example, the two-sample t test is equivalent to a t test on the coefficient of one binary treatment feature in ordinary least squares in addition to the constant. Specifically, in this example, the binary feature X is a vector of indicator variables for whether the user received treatment, where X=1 denotes treatment and X=0 denotes the control of no treatment. The experimentation platform then represents the difference between the treatment group's and the control group's average outcomes. Hence, in this example, the model represents the average treatment effect (ATE). The OLS estimator and inference on the hypothesis reduces to the two-sample t test for the difference in means.

In at least some embodiments, the experimentation platform computes the difference between the potential outcomes (e.g., for treatment and control) and is not limited to the particular implementation of the two-sample t test. This broader framing of the average treatment effect ensures that the analysis of online experiments may utilize regression frameworks and their extensions. In at least some cases, not all models can utilize counterfactual scoring to estimate a treatment effect. Estimated coefficients from OLS may not be consistent for their population parameters. In order for counterfactual scoring with OLS to produce a consistent estimate for the ATE, the experimentation platform relies on a property of OLS that makes estimates on a subset of coefficients consistent. Given a specified model, an OLS estimated coefficient is consistent for certain parameters, and the covariate matrix is full rank.

In another embodiment, the experimentation platform conducts a controlled, randomized experiment. In this experiment, an estimated coefficient (e.g., X) is consistent by construction: X is randomized so that it is uncorrelated with every possible variable. Therefore, as long as the estimated ATE is equivalent to a defined function, the defined function will be consistent for the population ATE. This property is what allows counterfactual scoring to produce consistent estimates for ATE. As such, the above embodiments demonstrate equivalence between OLS and the two-sample t test. The embodiments outlined further below describe multiple extensions that OLS provides, and motivate a general engineering implementation for the experimentation platform.

In at least some of the embodiments described herein, OLS takes advantage of a general covariate matrix in order to reduce the variance of the treatment effect. Suppose, in one example, that the covariate matrix has two types of covariates: the treatment indicator variable (e.g., X) and other covariates, (e.g., W). This example then assumes a specified linear model. In some cases, this specified model is extended beyond the t test equivalent. The ATE due to the treatment indicator may still be computed by scoring the model with two counterfactual inputs: the user has been treated, and the user has not been treated. In both scenarios, the experimentation platform holds other covariates for a user fixed.

The above equations are generalized, and it will be recognized that other equations may be used. In the model above with randomized treatment indicators, the experimentation platform queries the model twice with two different inputs and then takes the difference and averages it. For linear models, the experimentation platform describes this equation more generally by expressing the change in the model is the change in the matrix times a specified value. Then, the average treatment effect is simply the average change in the model. This provides four fundamental equations for computing the average treatment effect (ATE):

$$\Delta M = MTreatment - MControl \quad (1)$$

$$= M(X = 1; W = W) - M(X = 0; W = W) \quad (2)$$

$$\Delta \hat{y} = \Delta M \wedge \hat{\beta} \quad (3)$$

$$\widehat{ATE} = \frac{1}{n} 1_n^T \Delta \hat{y} \quad (4)$$

$$\mathrm{var}(\widehat{ATE}) = \left(\frac{1}{n} 1_n^T \Delta M\right) \mathrm{cov}(\hat{\beta}) \left(\frac{1}{n} 1_n^T \Delta M\right) \wedge T \quad (5)$$

The experimentation platform thus provides a generic way to express the ATE and the variance of the ATE in terms of the regression parameters and the potential outcomes that the experimenter wants to compare. This engineering abstraction allows developers of the model to add arbitrary amounts of covariates, and change the form of the model, for example using polynomial expansions, while the logic for the evaluation of the treatment effect remains the same. This leads to an important engineering design principle of separating the fitting process for the model from evaluating the treatment effect. Moreover, these equations allow an experimenter to achieve the causal effect directly and bypass multiple intermediate calculations. For example, many traditional software implementations for causal effects use a circuitous route for computation that involves multiple computational steps. These traditional implementations build on top of methods that were designed for correlational analyses, instead of causal analyses. Such traditional models thus include many unnecessary calculations. In contrast, the embodiments herein provide new fundamental equations and algorithms that calculate causal effects directly, bypassing many unnecessary computations found in traditional correlational analyses.

Among linear models, the experimentation platform uses one or more of the four equations identified above having different levels of complexity. In some embodiments, for example, an experimenter may introduce interaction terms in a regression. The equation (4) can still be written in the generalized form, even if regression contains an interaction term. Other methods may be performed to calculate the average treatment effect, where the ATE and variance on the ATE are computed in terms of $\Delta M$.

By including the interaction term, the experimentation platform may also query the model for the conditional average treatment effect, CATE. The CATE is the average treatment effect for a specific group of users. In one implementation, the experimentation platform filters the Δy vector to the users in the group, and then recomputes an average. Using interaction terms in the model, whether to improve the form of the model or to query for heterogeneity in treatment effects, adds little engineering overhead to the evaluation of the treatment effect. Using a general form for linear treatment effects, the experimentation platform does not need to account for how coefficients or covariances are to be combined in order to compute a distribution of the average or conditional average treatment effect. The computation for ATE and CATE are similar enough to where experimenters may design engineering systems that respond to live analysis queries quickly and efficiently. For both ATE and CATE queries, the experimentation platform is configured to fit an OLS model (in some cases, the ATE is equivalent to the CATE computed over all users. At least one of the differences between evaluating an ATE query and evaluating a CATE query is the vector multiplier. For CATE queries, the experimentation platform changes which group is analyzed.

In at least some embodiments, the experimentation platform structures the corresponding engineering system in phases. Such embodiments involve an algorithm for computing treatment effects in a live manner using one or more of the following steps: 1) fit a model using X, W, and y, 2) using the model from step 1, query the potential outcomes for some or all users, creating the Δy vector, 3) receive an analysis query for ATE or CATE(g), 4) aggregate the potential outcomes from step 2 to compute either ATE or CATE (g), and 5) receive an analysis query for a different g'. Without refitting the model, the algorithm further aggregates the potential outcomes again as in step 4.

In this structure, queries for ATE and CATE reuse computations from steps 1 and 2. Although queries for ATE are performed faster by looking up the relevant coefficient in a table, standardizing the implementations to use the general form enables one single computer system to handle both average and conditional average treatment effects, simplifying the engineering system's design. This leads to a second engineering design principle: compute counterfactual scores first, and then aggregate on the fly. This is different than traditional two-sample t test design of aggregating first, then computing differences in aggregates.

Introducing interaction terms in the regression allows the experimentation platform to model heterogeneity in treatment effects, where the treatment effect is a function of, for example, X and W. Likewise, the experimentation platform makes the covariance matrix a function of X and W, as well by using heteroskedasticity-robust (HC-robust) covariances. Estimating regression coefficients with HC-robust estimated covariances does not change the point estimates of the regression parameters and, as such, at least in some cases, point estimates of the ATE and CATE do not change. HC-robust covariances do change $cob(\hat{\beta})$, changing the variance of the treatment effects. The experimentation platform may still have a unified compute strategy by abstracting functions for different types of $cov(\hat{\beta})$. Furthermore, since (at least in some cases) point estimates do not change, the structure of the engineering system still prebuilds the Δy vector, and different variances only get computed during the live query.

Heterogeneity in treatment effects provides a mechanism to see treatment effects for a group. To see treatment effects through time, the experimentation platform records multiple observations per user in the experiment, forming a longitudinal study. The treatment effect varies in time due to the treatment's diminishing effect or interactions with other experiments. In some cases, the experimentation platform is configured to estimate a regression with user-level fixed effects, time effects, heterogeneous treatment effects, and treatment effects that vary over time. In some cases, the point estimate of the ATE is still computed by taking the difference in potential outcomes. Because the observations in M are not independent and identically distributed, the experimentation platform uses clustered covariances to prevent overconfidence in the variance of the ATE due to autocorrelation within users. Using clustered covariances only changes $cov(\hat{\beta})$, so again by leaving the variance of the ATE in terms of the covariance of the regression parameters, the experimentation platform is future proof to longitudinal regression.

One embodiment provides an engineering checklist in order to establish a good baseline implementation of a simple and generalized system to compute treatment effects using linear models. Additionally, optimizations are provided to enhance scalability while preserving its generality. This example checklist includes, for each outcome, these steps: 1) construct a model matrix M using the data, 2) fit an OLS model using M and y to get ($\hat{\beta}$) and $cov(\hat{\beta})$, 3) construct two additional model matrices $M^{Treatment}$ and $M^{Control}$ by modifying the model matrix to set everyone in the treatment and control groups, respectively. Construct ΔM and $\Delta A\hat{y}=\Delta M\hat{\beta}$, 4) receive a query for either ATE or CATE(g) and filter Δy according to the relevant users and aggregate.

In one embodiment, an engineering system is estimating causal effects for the treatment variable (e.g., X) on multiple different outcomes. The engineering system may indicate that some or all outcomes are being analyzed with the same features. Then, for each outcome, the engineering system computes regression coefficients and covariances. Instead of fitting multiple OLS models, the engineering system described herein fits one multi-response OLS model. If all models use the same matrix, then the engineering system extends the matrix-vector multiplication to be a matrix-matrix multiplication, yielding a matrix of coefficients that has specified dimensions. Likewise, to compute the covariance matrices, the engineering system computes and saves exactly once (at least in this embodiment) for all of the different outcomes. Lastly, the engineering system estimates residuals, which are computed in a vectorized way.

A model matrix (e.g., M) may have many zeros in it. In some cases, the dummy variable encoding of a categorical variable in the data may already make matrix M sparse. The storage is then optimized by using sparse matrix data structures (e.g., in the compressed sparse column (CSC) format). Furthermore, the linear algebra used to estimate OLS is accelerated using sparse linear algebra. For example, the multiplication $M^TM$ in OLS would normally run $np^2$ floating point operations, but if the sparsity rate of M is (e.g., s) an optimized sparse linear algebra library, such as that described herein, only needs to compute $(n*s)p^2$ operations. The operation $(M^TM)$, where M has categorical variables with many levels, may also be sparse and, as such, the engineering system inverts the operation using a sparse Cholesky decomposition. Some implementations use matrix factorization algorithms to solve these large sparse linear systems efficiently, while other implementations use numerical libraries such as Eigen.

For parametric tests, the engineering system compresses the data down to a sufficient set of statistics, which, as the term is used herein, are the minimal information needed to recover the distribution of the data. OLS is based on the normal distribution, which has sufficient statistics n, Σy, and Σy². Some embodiments illustrate how to adapt the fitting process for OLS to use sufficient statistics, and how to achieve acceptable compression rates without biasing the treatment effect.

In the four equations described above for computing the average treatment effect, for 0-1 treatment variables, it may not be necessary in some cases to materialize the Δy vector (and, in some cases, it may be computationally expensive to do so). The Δy vector will go through an aggregation step, so that the engineering system can directly compute the parts needed for that specific aggregation. The variance of the treatment effect is also computed efficiently from the column means of ΔM. In such cases, no counterfactual model matrices may be needed. In the computation for CATE(g), the engineering system finds users in the group g, and then aggregates. The engineering system then sorts the data according to the grouping variables (e.g., g1; g2; and so on), which allow the system to find relevant users for group g quickly.

By sorting, the system incurs an upfront cost of O(nlog (n)). After the data has been sorted, users for the group g are in consecutive rows. Using a single pass over the sorted data, the system identifies the relevant submatrices of ΔM to aggregate for any group. In one case, for example, the system assumes there are G groups for which CATE is to be computed. The cost for sorting here is O(nlog(n)+n). Without sorting, each group is to scan the entire dataset to find relevant users and the complexity is O(nG). When G is sufficiently large, the gain from forming consecutive rows outweighs the cost of sorting.

Accordingly, the embodiments outlined above describe multiple ways to compute treatment effects. Even within linear models, there may be at least three variations of treatment effects: average treatment effects, conditional average treatment effects, and dynamic treatment effects. The engineering system described herein measures these effects, is future proof to other extensions, and provides a simple yet comprehensive architecture. Using a counterfactual scoring framework with OLS, the systems described herein create a general and understandable compute strategy for these effects. Each of these variations may be estimated using the computational framework: $\Delta\hat{y}=\Delta M\ \hat{\beta}$. For many use cases, the systems herein compute the difference in potential outcomes without constructing any counterfactual model matrices, which provides simplified computations. In addition to unifying the computational strategies for three types of treatment effects, the embodiments described herein also offer optimizations on the computational framework that make an engineering system scalable and practical.

Figure 8:
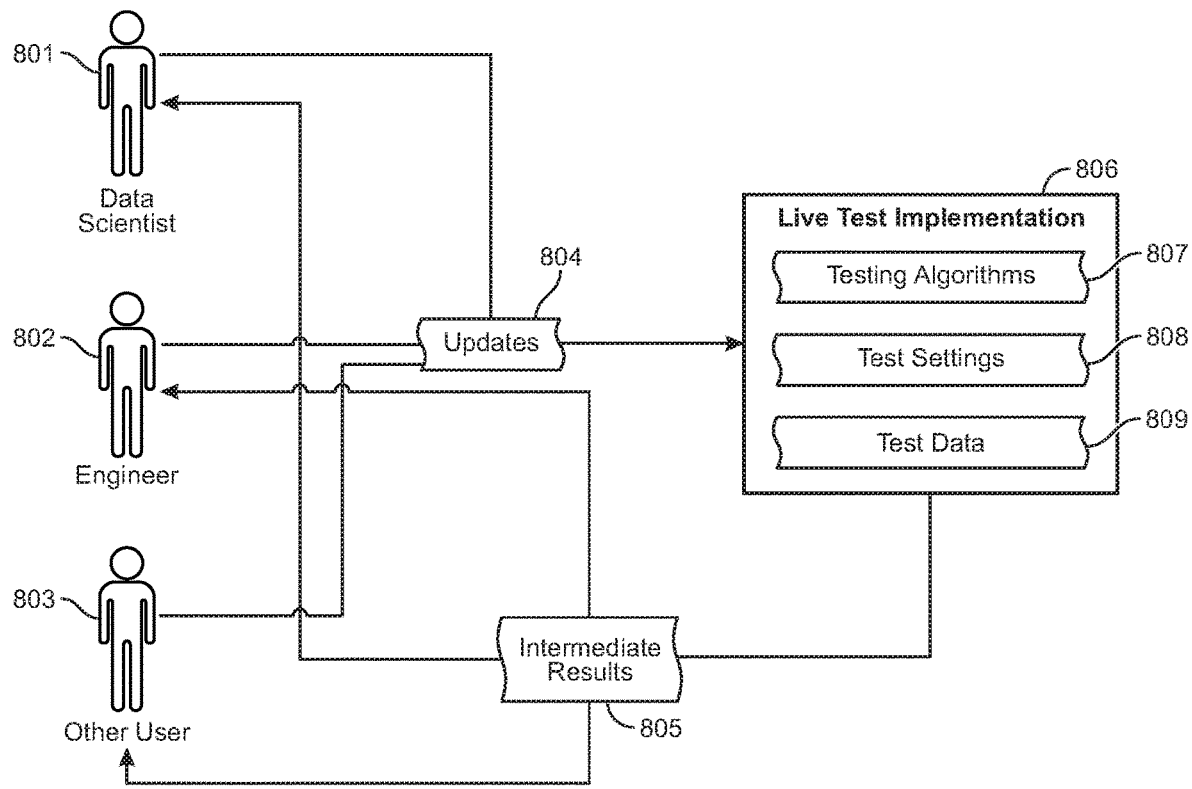
FIG. 8 illustrates an embodiment in which a user updates a test implementation during execution.

Turning now to FIG. 8, in some cases, a test implementation or the specific algorithms used in the test implementation are updated while the test implementation is being carried out. For example, FIG. 8 illustrates a live test implementation 806 which may be the same as or different than test implementation 117 of FIG. 1. The test implementation 806 includes testing algorithms 807 (e.g., the four fundamental equations for computing the average treatment effect (ATE) described above). The testing algorithms 807 may include substantially any number or type of algorithms, equations, methods, or other test implementation techniques. The live test implementation 806 also includes test settings 808, which include various parameters, modifications, versions, or alternative settings under which the live test implementation 806 is carried out. Still further, the live test implementation 806 includes test data 809 which may be the same as or different than data 116 of FIG. 1. The test data 809 includes data used during the test implementation including code, settings, metadata, input data, and/or update data (e.g., 804), as well as output data generated by the live test implementation 806.

In some cases, the users working with the live test implementation 806 want to change one or more testing algorithms 807, test settings 808, and/or test data 809. The embodiments described herein allow data scientists (e.g., 801), engineers (e.g., 802), or other types of users (e.g., 803) to provide updates 804 to the live test implementation 806. In some embodiments, the updates 804 change test settings 808, or change testing algorithms 807, or change test data 809 used by the live test implementation 806. Thus, in this manner, test engineers or data scientists or other users provide updates 804 and the live test implementation 806 incorporates those updates and then uses the updated algorithms, the updated test settings, and/or the updated test data. In contrast to existing testing systems that require users to wait until the test is complete before allowing changes to algorithms, settings, or data, the embodiments described herein allow users to update and make changes to these items on the fly where they are dynamically incorporated into the live test implementation. Then, after incorporating the new algorithms, settings, and/or data, the live test implementation 806 provides intermediate test results 805 to the various users showing the changes resulting from the updates to the algorithms, settings, and/or data.

Accordingly, users of the systems described herein no longer have to wait for a new A/B test or other type of test to be implemented to get intermediate test results 805. This saves large amounts of time and computing resources in not having to finish a test that is no longer valuable and, instead, concentrating those computing resources on updates 804 that are more important to the managers and users of the live test implementation 806. In some cases, the computer system 101 of FIG. 1 presents the intermediate test results 805 from the live test implementation 806 to the various users 801-803 while the test implementation 806 is executing. In some examples, computer system 101 displays the intermediate test results 805 in a graphical user interface (GUI) on a personal computer (PC), laptop, tablet, smartphone, artificial reality device, or other electronic device, or transmits the intermediate test results 805 to another computer system for display.

In this manner, the creators, managers, and users of the live test implementation 806 are continually apprised of the intermediate test results 805 of the test, and are able to see, in real time, whether a specified difference in features (e.g., in updates 804) is having an expected effect. The users 801-803 then determine how they want to respond to the intermediate results, perhaps by merely continuing the live test implementation 806, or perhaps by supplying additional updates 804, potentially changing the live test implementation's testing algorithms 807, the test settings 808, and/or the test data 809. As such, the embodiments described herein provide full flexibility when designing, instantiating, and updating a test implementation, even while that test implementation is currently running.

Once the data has been selected for a given test implementation (e.g., 117 of FIG. 1 or 806 of FIG. 8), the underlying system compresses at least some of that data. In some cases, the system (e.g., data compressing module 111 of computer system 101) compresses the data 116/809 using one or more of the algorithms defined herein. In some embodiments, the data compressing module 111 compresses specific identified portions of the data to remove those portions of the data that are unused in the specified testing algorithms being used. Thus, in cases where the live test implementation 806 involves certain testing algorithms 807 and test data 809, data compressing module 111 compresses the test data 809 to remove any data not used by those algorithms. If the testing algorithms 807 are updated by an engineer, data scientist, or other user, the data compressing module 111 may recompress the test data 809 such that the test data only includes the data that will actually be used by the updated algorithms. Thus, as engineers or data scientists make changes to the testing algorithms, the identifying module 109 will reevaluate which data and algorithms are being used in the updated version, and the data compressing module 111 will recompress the data 116 to remove data not being used by the updated testing algorithms 121.

In addition to this initial culling of data not used by the algorithms in the test implementation 806, the data compressing module 111, in at least some case, also compresses the data that is being used by the algorithms of the test implementation. In some embodiments, this compression involves categorizing portions of the test data 809 that are used in the testing algorithms into bins. For example, as described above in conjunction with FIG. 5, the data compressing module 111 of FIG. 1 categorizes the data used by the testing algorithms into Bin 1, Bin 2, Bin 3, or Bin 4. In some examples, the data compressing module 111 categorizes the data according to different subsets of users that are part of the test implementation 806. Thus, in this example, Bin 1 may include data for users from country X, Bin 2 may include users from country Y, Bin 3 may include users from country Z, and Bin 4 may include users from a grouping of countries. Of course, other configurations are possible, and the data being stored in each bin may be categorized accordingly to substantially any type of rule, setting, parameter, or metric. Thus, at least in some examples, each bin may include data for a subset of users or other test subjects that are part of the live test implementation 806.

In some cases, the computer system 101 is configured to label each of these bins with a tag that is part of a schema. The schema is designed to help track those portions of the accessed data that are used in the testing algorithms 807. The schema specifies, for example, which subsets of users are assigned to each bin. If the users 801-803 make updates 804 to the test implementation 806 that affect the users involved in the test, the computer system 101 may also be configured to update the tags for the bins in accordance with the changes to the test implementation 806. Using a schema in this manner allows the testing system described herein to be implemented in a wide range of industries and in a variety of different types of testing scenarios.

In some examples, the data compressing module 111 is configured to track specific items used by or referenced in the test implementation 806. Thus, for instance, the data compressing module compresses the specified portions of the test data 809 to remove portions of the data that are unused in the specified testing algorithms. As part of this process, the data compressing module 111 may track count, sum, and/or sum of squares, among other potentially significant items. In some cases, the users designing or implementing the test choose which items will be tracked during the live test implementation 806, including potentially count, sum, sum of squares, or other measurement devices. Still further, because the compression steps and algorithms described herein reduce the amount of data needed to run a live test implementation to such a degree, the embodiments described herein are configured to work with mathematical models, t tests, covariate adjustments, longitudinal models, quantile bootstrap, quantile regression, or other types of tests.

In some cases, the data compressing module 111 is configured to compress the data within data clusters. In other cases, the data compressing module 111 is configured to compress data between data clusters. In cases where the data compressing module 111 compresses data within data clusters, the compression occurs within a single cluster of data. Thus, if a cluster of data in a live test implementation is associated with users from a certain country within an age range of 18-30, the data from many different users fitting that category may all be compressed together within the same data cluster. In some cases, the data compressing module 111 moves the data into contiguous data chunks within that cluster, so that the data in that cluster is physically located together and is thus more quickly accessible.

When compression occurs between data clusters, in at least some embodiments, the data in each cluster corresponds to specific user groups or to specific parts of a test implementation. Thus, in some cases, user interactions with a particular movie or television show are monitored and recorded as part of the live test implementation. The computer system 101, for example, monitors and records users' interactions with different movies or videos each in a different data cluster. Or, in other cases, the computer system 101 records different types of users' interactions (e.g., users in different age groups or users living in different countries) with the same video each in different data clusters. The computer system 101 then compresses the data in each cluster individually and between the various clusters. In some cases, the computer system 101 also labels each cluster according to a specified schema with unique tags for each cluster.

In some embodiments, the compression algorithms used by the data compressing module 111 are tunably lossy. Thus, when the data compressing module 111 is compressing those portions of data that are unused in the testing algorithms for a given test, the algorithms used may be tunably lossy. As the term is used herein, "tunably lossy" refers to lossy compression that is tunable or changeable in that the amount of loss may be set to a specific level. The amount of data lost in compression (i.e., data loss that cannot be recovered after compression) is different for different algorithms. Some compression algorithms lose more data than other algorithms. In the embodiments herein, the data compressing module 111 is configured to allow users to specify how much data loss is acceptable for any given test implementation. In some cases, more or less data loss may be permissible for certain tests. Thus, in some cases, users (e.g., 801-803) specify how much data loss is tolerable for a live test implementation (e.g., 806) and apply that setting to the test implementation. Once set, the users "tune" or change the amount of acceptable data loss through updates 804. The settings changes are carried out by the processor 102 or by electronic controllers such as programmable logic devices (PLDs). In some embodiments, controllers are used to determine how much data loss through compression is tolerable for a given compression operation. That amount of data loss is then changed for different operations that use different testing algorithms and/or test settings.

Figure 9:
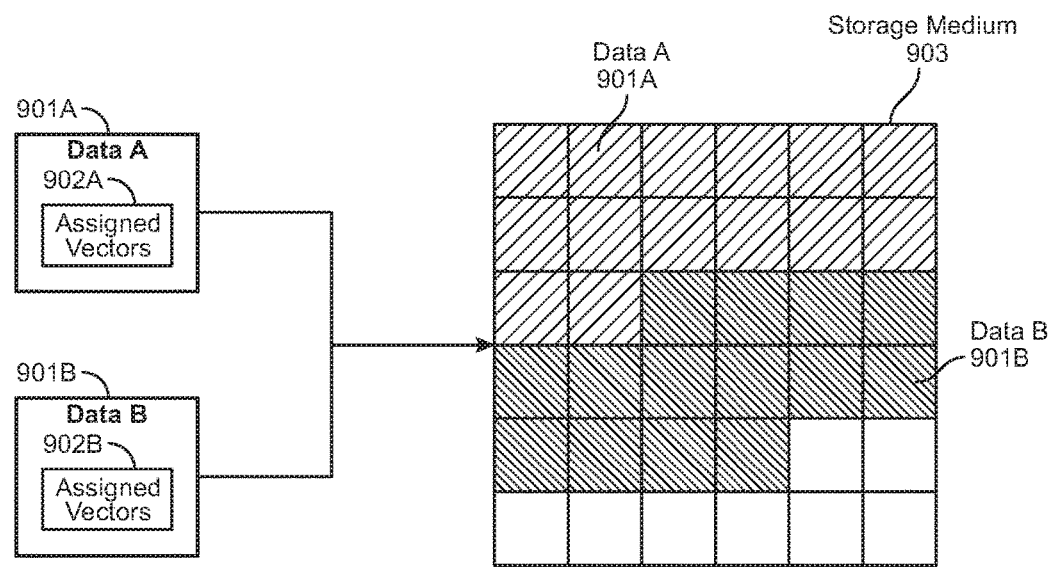
FIG. 9 illustrates an embodiment in which data is spatially located on a data storage medium.
Figure 10:
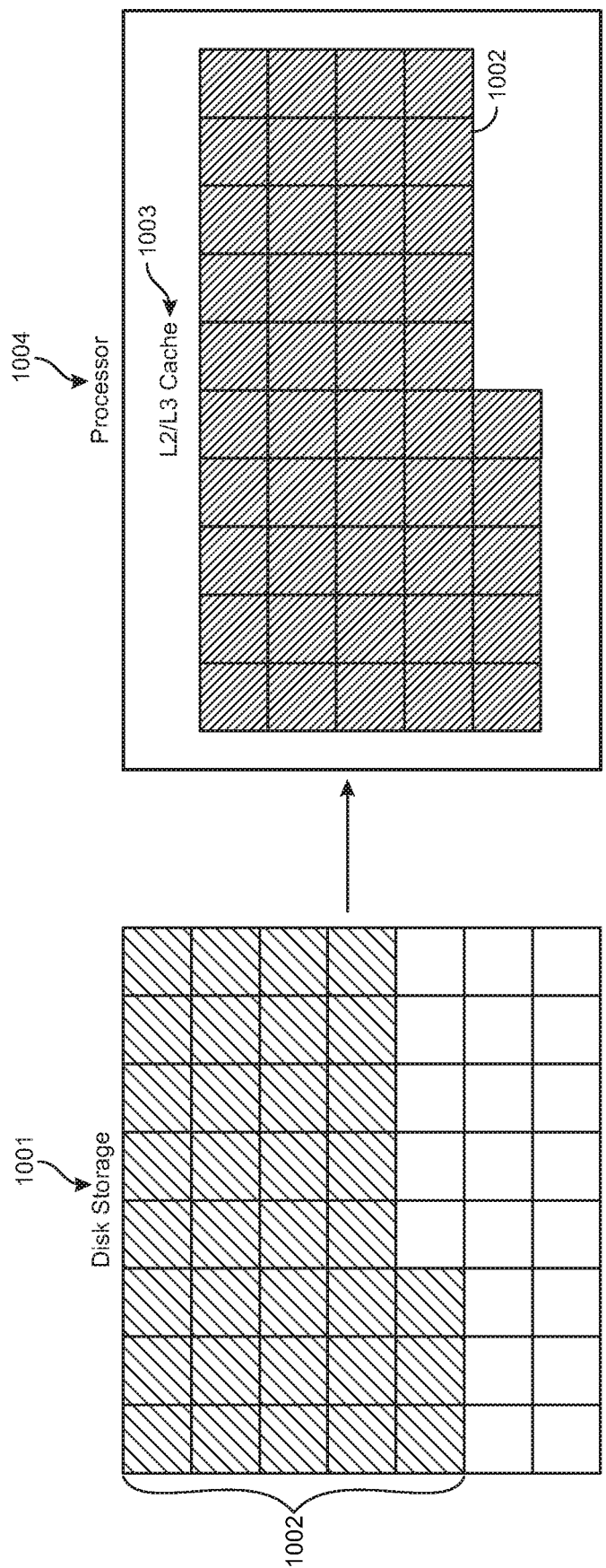
FIG. 10 illustrates an embodiment in which a data chunk is moved from a data store to cache memory on a processor.

FIG. 9 illustrates an embodiment in which the computer system 101 of FIG. 1 organizes the resulting compressed data in memory to spatially locate at least some of the data next to each other in a data storage medium. For example, data 901A and data 901B are stored on storage medium 903 of FIG. 9. The storage medium 903 may be substantially any type of volatile or non-volatile memory, including random access memory (RAM), processor cache memory (e.g., L2/L3 cache memory), solid state or spinning hard disks, optical discs, thumb drives, or other types of data storage. As can be seen in FIG. 9, the data 901A are stored in a series of sequential memory blocks, and data 901B is stored in sequential blocks that appear after the data blocks of data 901A. Thus, the data 901A are stored as one contiguous block, and the data 901B are stored as one contiguous block. Other data may be stored in other blocks in other parts of the storage medium 903. The computer system 101 stores the data in this manner for faster access and for faster moving of data blocks to other locations in memory or storage. For instance, in one example, the computer system 101 moves a block of data 1002 in disk storage 1001 to L2/L3 cache 1003 of processor 1004 in FIG. 10.

In some cases, the organized, compressed data that is spatially located in memory is arranged according to assigned vectors. In FIG. 9, for example, data 901A includes assigned vectors 902A, while data 901B includes assigned vectors 902B. These vectors indicate where the data is to be stored on the storage medium 903. The vectors prescribe locations on the storage medium 903 where a chunk of data is to be stored (e.g., test data that corresponds to a given set of users, or data received from users of a certain country, or watchers of a specific tv show or movie, etc.). Thus, in some examples, the computer system 101 spatially arranges the data from different subgroups of a test implementation (e.g., 806 of FIG. 8) so that it is stored in a common group or data chunk. Then, if the test implementation involves one or more computations on that data, the data may easily be moved as a chunk to cache memory, as in FIG. 10. In some embodiments, the computer system 101 moves chunks of compressed data, arranged according to the assigned vectors 902A/902B, to L2/L3 cache memory 1003 on a physical processor (e.g., 1004). With the data chunk being fully located on the L2/L3 cache, the processor no longer needs to access disk storage 1001 or storage medium 903. Rather, some or all of the data needed for a computation is located in the L2/L3 cache of the processor, making such computations much faster (e.g., in some cases, orders of magnitude faster).

For instance, in some embodiments, the processor 1004 is configured to compute matrix sum operations. The processor 1004 performs these matrix sum operations on the chunk of compressed data 1002 that was moved to the cache memory location located in the L2/L3 cache 1003 of the processor 1004. Because at least some of the algorithms described herein are designed to compute sum operations on matrices (as opposed to multiplication operations on the matrices), the sums are computed very quickly, returning test results to data scientists and engineers in a matter of seconds, all computed on a single computer system. The algorithms described above implement sparse linear algebra, and are designed to work with much smaller amounts of data than have been used in the past. Thus, the testing algorithms described herein are optimized to reduce processing resource usage by both reducing the amount of data used in the test (through potentially multiple levels of compression) and by changing the processing steps to summing steps (as opposed to multiplication steps) that can be quickly computed. Moreover, because the amount of test data is so greatly reduced and because the embodiments herein spatially locate the data in memory, the data can be easily moved in chunks into cache memory where the computations are performed much more quickly, as the data accessing times are greatly reduced.

In addition to the methods described above, a system for implementing an interactive testing platform is also provided. The system includes at least one physical processor and physical memory that includes computer-executable instructions which, when executed by the physical processor, cause the physical processor to: access data that is to be used as part of a test implementation that has a plurality of potential outcomes, determine that the test implementation is to be carried out using one or more specified testing algorithms that test for at least one of the potential outcomes, identify portions of the accessed data that are to be used in the specified testing algorithms, compress the identified portions of the accessed data to remove portions of the accessed data that are unused in the specified testing algorithms, and execute the test implementation using the specified testing algorithms with the compressed accessed data.

A non-transitory computer-readable medium is also provided that includes computer-executable instructions which, when executed by at least one processor of a computing device, cause the computing device to: access data that is to be used as part of a test implementation that has a plurality of potential outcomes, determine that the test implementation is to be carried out using one or more specified testing algorithms that test for at least one of the potential outcomes, identify portions of the accessed data that are to be used in the specified testing algorithms, compress the identified portions of the accessed data to remove portions of the accessed data that are unused in the specified testing algorithms, and execute the test implementation using the specified testing algorithms with the compressed accessed data.

Figure 11:
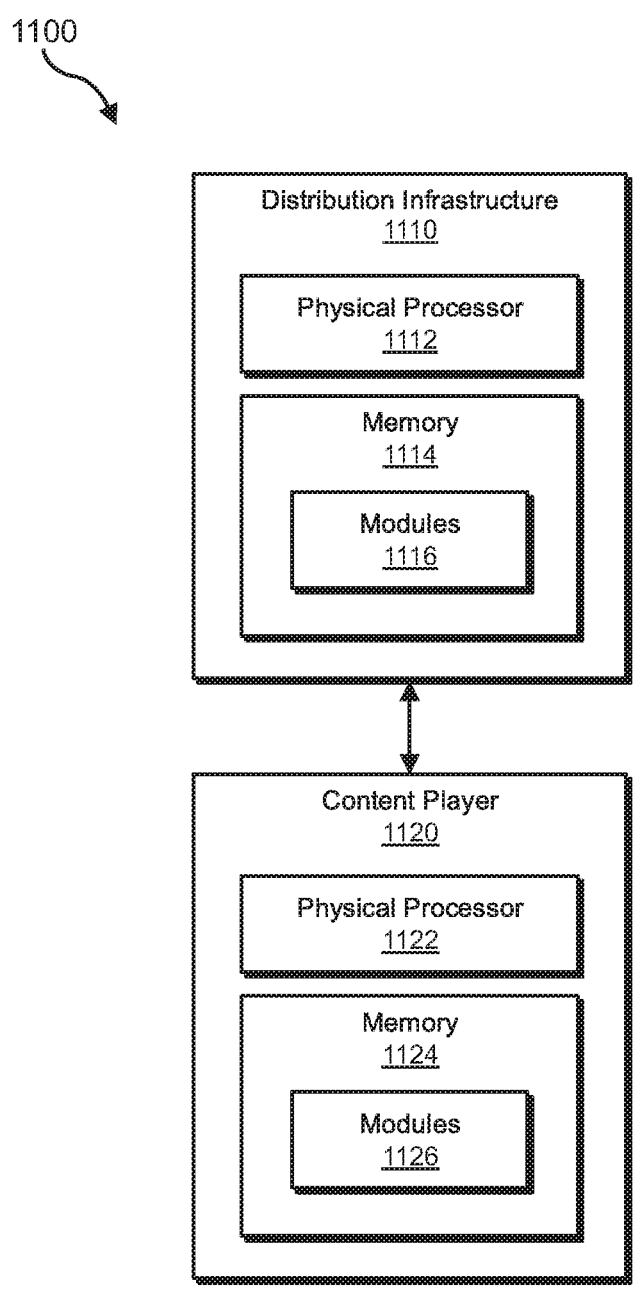
FIG. 11 is a block diagram of an exemplary content distribution ecosystem.
Figure 12:
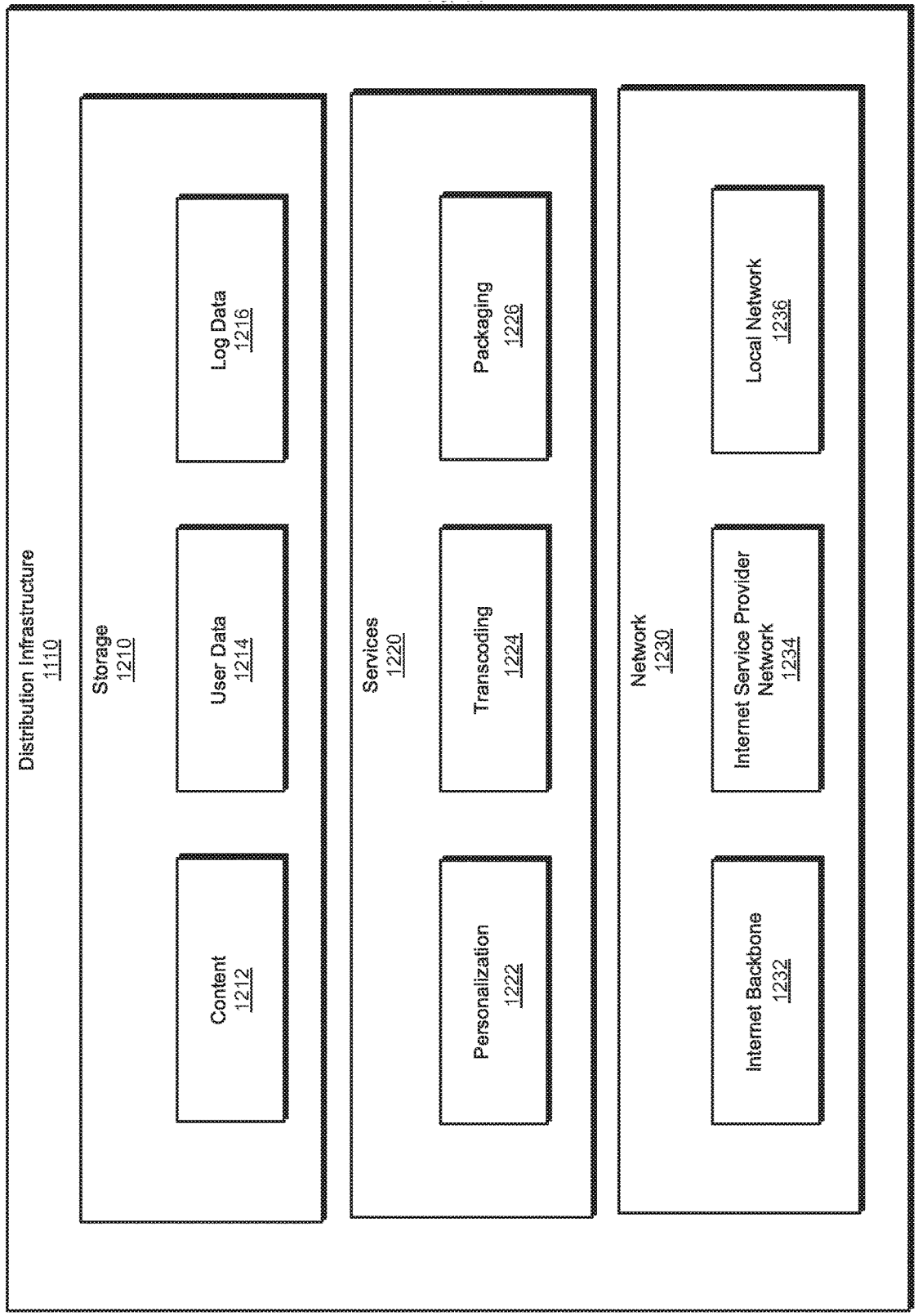
FIG. 12 is a block diagram of an exemplary distribution infrastructure within the content distribution ecosystem shown in FIG. 11.
Figure 13:
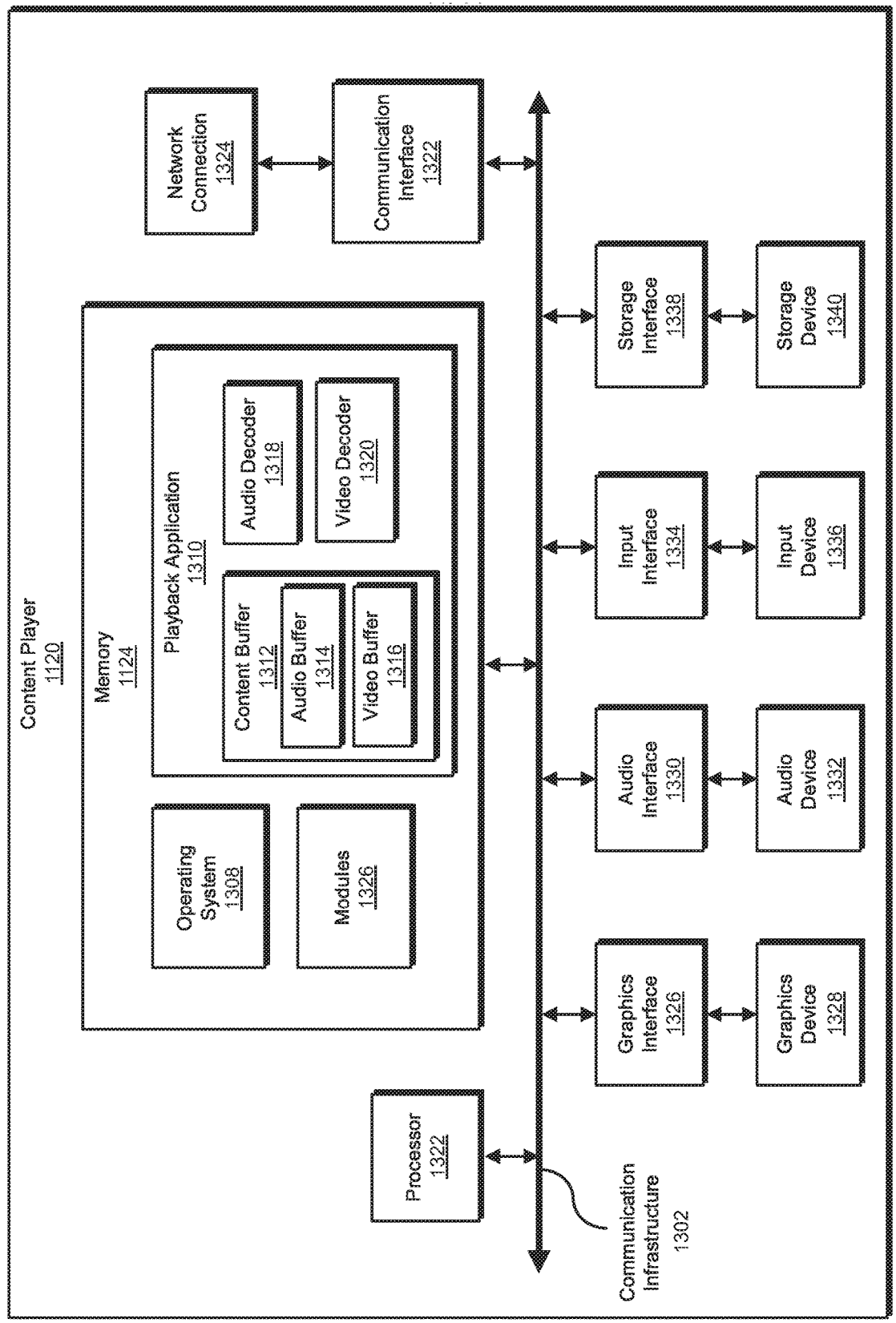
FIG. 13 is a block diagram of an exemplary content player within the content distribution ecosystem shown in FIG. 11.

The following will provide, with reference to FIG. 11, detailed descriptions of exemplary ecosystems in which content is provisioned to end nodes and in which requests for content are steered to specific end nodes. The discussion corresponding to FIGS. 12 and 13 presents an overview of an exemplary distribution infrastructure and an exemplary content player used during playback sessions, respectively.

FIG. 11 is a block diagram of a content distribution ecosystem 1100 that includes a distribution infrastructure 1110 in communication with a content player 1120. In some embodiments, distribution infrastructure 1110 is configured to encode data at a specific data rate and to transfer the encoded data to content player 1120. Content player 1120 is configured to receive the encoded data via distribution infrastructure 1110 and to decode the data for playback to a user. The data provided by distribution infrastructure 1110 includes, for example, audio, video, text, images, animations, interactive content, haptic data, virtual or augmented reality data, location data, gaming data, or any other type of data that is provided via streaming.

Distribution infrastructure 1110 generally represents any services, hardware, software, or other infrastructure components configured to deliver content to end users. For example, distribution infrastructure 1110 includes content aggregation systems, media transcoding and packaging services, network components, and/or a variety of other types of hardware and software. In some cases, distribution infrastructure 1110 is implemented as a highly complex distribution system, a single media server or device, or anything in between. In some examples, regardless of size or complexity, distribution infrastructure 1110 includes at least one physical processor 1112 and at least one memory device 1114. One or more modules 1116 are stored or loaded into memory 1114 to enable adaptive streaming, as discussed herein.

Content player 1120 generally represents any type or form of device or system capable of playing audio and/or video content that has been provided over distribution infrastructure 1110. Examples of content player 1120 include, without limitation, mobile phones, tablets, laptop computers, desktop computers, televisions, set-top boxes, digital media players, virtual reality headsets, augmented reality glasses, and/or any other type or form of device capable of rendering digital content. As with distribution infrastructure 1110, content player 1120 includes a physical processor 1122, memory 1124, and one or more modules 1126. Some or all of the adaptive streaming processes described herein is performed or enabled by modules 1126, and in some examples, modules 1116 of distribution infrastructure 1110 coordinate with modules 1126 of content player 1120 to provide adaptive streaming of multimedia content.

In certain embodiments, one or more of modules 1116 and/or 1126 in FIG. 11 represent one or more software applications or programs that, when executed by a computing device, cause the computing device to perform one or more tasks. For example, and as will be described in greater detail below, one or more of modules 1116 and 1126 represent modules stored and configured to run on one or more general-purpose computing devices. One or more of modules 1116 and 1126 in FIG. 11 also represent all or portions of one or more special-purpose computers configured to perform one or more tasks.

In addition, one or more of the modules, processes, algorithms, or steps described herein transform data, physical devices, and/or representations of physical devices from one form to another. For example, one or more of the modules recited herein receive audio data to be encoded, transform the audio data by encoding it, output a result of the encoding for use in an adaptive audio bit-rate system, transmit the result of the transformation to a content player, and render the transformed data to an end user for consumption. Additionally or alternatively, one or more of the modules recited herein transform a processor, volatile memory, non-volatile memory, and/or any other portion of a physical computing device from one form to another by executing on the computing device, storing data on the computing device, and/or otherwise interacting with the computing device.

Physical processors 1112 and 1122 generally represent any type or form of hardware-implemented processing unit capable of interpreting and/or executing computer-readable instructions. In one example, physical processors 1112 and 1122 access and/or modify one or more of modules 1116 and 1126, respectively. Additionally or alternatively, physical processors 1112 and 1122 execute one or more of modules 1116 and 1126 to facilitate adaptive streaming of multimedia content. Examples of physical processors 1112 and 1122 include, without limitation, microprocessors, microcontrollers, central processing units (CPUs), field-programmable gate arrays (FPGAs) that implement softcore processors, application-specific integrated circuits (ASICs), portions of one or more of the same, variations or combinations of one or more of the same, and/or any other suitable physical processor.

Memory 1114 and 1124 generally represent any type or form of volatile or non-volatile storage device or medium capable of storing data and/or computer-readable instructions. In one example, memory 1114 and/or 1124 stores, loads, and/or maintains one or more of modules 1116 and 1126. Examples of memory 1114 and/or 1124 include, without limitation, random access memory (RAM), read only memory (ROM), flash memory, hard disk drives (HDDs), solid-state drives (SSDs), optical disk drives, caches, variations or combinations of one or more of the same, and/or any other suitable memory device or system.

FIG. 12 is a block diagram of exemplary components of content distribution infrastructure 1110 according to certain embodiments. Distribution infrastructure 1110 includes storage 1210, services 1220, and a network 1230. Storage 1210 generally represents any device, set of devices, and/or systems capable of storing content for delivery to end users. Storage 1210 includes a central repository with devices capable of storing terabytes or petabytes of data and/or includes distributed storage systems (e.g., appliances that mirror or cache content at Internet interconnect locations to provide faster access to the mirrored content within certain regions). Storage 1210 is also configured in any other suitable manner.

As shown, storage 1210 may store a variety of different items including content 1212, user data 1214, and/or log data 1216. Content 1212 includes television shows, movies, video games, user-generated content, and/or any other suitable type or form of content. User data 1214 includes personally identifiable information (PII), payment information, preference settings, language and accessibility settings, and/or any other information associated with a particular user or content player. Log data 1216 includes viewing history information, network throughput information, and/or any other metrics associated with a user's connection to or interactions with distribution infrastructure 1110.

Services 1220 includes personalization services 1222, transcoding services 1224, and/or packaging services 1226. Personalization services 1222 personalize recommendations, content streams, and/or other aspects of a user's experience with distribution infrastructure 1110. Encoding services 1224 compress media at different bitrates which, as described in greater detail below, enable real-time switching between different encodings. Packaging services 1226 package encoded video before deploying it to a delivery network, such as network 1230, for streaming.

Network 1230 generally represents any medium or architecture capable of facilitating communication or data transfer. Network 1230 facilitates communication or data transfer using wireless and/or wired connections. Examples of network 1230 include, without limitation, an intranet, a wide area network (WAN), a local area network (LAN), a personal area network (PAN), the Internet, power line communications (PLC), a cellular network (e.g., a global system for mobile communications (GSM) network), portions of one or more of the same, variations or combinations of one or more of the same, and/or any other suitable network. For example, as shown in FIG. 12, network 1230 includes an Internet backbone 1232, an internet service provider 1234, and/or a local network 1236. As discussed in greater detail below, bandwidth limitations and bottlenecks within one or more of these network segments triggers video and/or audio bit rate adjustments.

FIG. 13 is a block diagram of an exemplary implementation of content player 1120 of FIG. 11. Content player 1120 generally represents any type or form of computing device capable of reading computer-executable instructions. Content player 1120 includes, without limitation, laptops, tablets, desktops, servers, cellular phones, multimedia players, embedded systems, wearable devices (e.g., smart watches, smart glasses, etc.), smart vehicles, gaming consoles, internet-of-things (IoT) devices such as smart appliances, variations or combinations of one or more of the same, and/or any other suitable computing device.

As shown in FIG. 13, in addition to processor 1122 and memory 1124, content player 1120 includes a communication infrastructure 1302 and a communication interface 1322 coupled to a network connection 1324. Content player 1120 also includes a graphics interface 1326 coupled to a graphics device 1328, an input interface 1334 coupled to an input device 1336, and a storage interface 1338 coupled to a storage device 1340.

Communication infrastructure 1302 generally represents any type or form of infrastructure capable of facilitating communication between one or more components of a computing device. Examples of communication infrastructure 1302 include, without limitation, any type or form of communication bus (e.g., a peripheral component interconnect (PCI) bus, PCI Express (PCIe) bus, a memory bus, a frontside bus, an integrated drive electronics (IDE) bus, a control or register bus, a host bus, etc.).

As noted, memory 1124 generally represents any type or form of volatile or non-volatile storage device or medium capable of storing data and/or other computer-readable instructions. In some examples, memory 1124 stores and/or loads an operating system 1308 for execution by processor 1122. In one example, operating system 1308 includes and/or represents software that manages computer hardware and software resources and/or provides common services to computer programs and/or applications on content player 1120.

Operating system 1308 performs various system management functions, such as managing hardware components (e.g., graphics interface 1326, audio interface 1330, input interface 1334, and/or storage interface 1338). Operating system 1308 also provides process and memory management models for playback application 1310. The modules of playback application 1310 includes, for example, a content buffer 1312, an audio decoder 1318, and a video decoder 1320.

Playback application 1310 is configured to retrieve digital content via communication interface 1322 and to play the digital content through graphics interface 1326. Graphics interface 1326 is configured to transmit a rendered video signal to graphics device 1328. In normal operation, playback application 310 receives a request from a user to play a specific title or specific content. Playback application 310 then identifies one or more encoded video and audio streams associated with the requested title. After playback application 1310 has located the encoded streams associated with the requested title, playback application 1310 downloads sequence header indices associated with each encoded stream associated with the requested title from distribution infrastructure 1110. A sequence header index associated with encoded content includes information related to the encoded sequence of data included in the encoded content.

In one embodiment, playback application 1310 begins downloading the content associated with the requested title by downloading sequence data encoded to the lowest audio and/or video playback bit rates to minimize startup time for playback. The requested digital content file is then downloaded into content buffer 1312, which is configured to serve as a first-in, first-out queue. In one embodiment, each unit of downloaded data includes a unit of video data or a unit of audio data. As units of video data associated with the requested digital content file are downloaded to the content player 1120, the units of video data are pushed into the content buffer 1312. Similarly, as units of audio data associated with the requested digital content file are downloaded to the content player 1120, the units of audio data are pushed into the content buffer 1312. In one embodiment, the units of video data are stored in video buffer 1316 within content buffer 1312 and the units of audio data are stored in audio buffer 1314 of content buffer 1312.

A video decoder 1310 reads units of video data from video buffer 1316 and outputs the units of video data in a sequence of video frames corresponding in duration to the fixed span of playback time. Reading a unit of video data from video buffer 1316 effectively de-queues the unit of video data from video buffer 1316. The sequence of video frames is then rendered by graphics interface 1326 and transmitted to graphics device 1328 to be displayed to a user.

An audio decoder 1318 reads units of audio data from audio buffer 1314 and output the units of audio data as a sequence of audio samples, generally synchronized in time with a sequence of decoded video frames. In one embodiment, the sequence of audio samples is transmitted to audio interface 1330, which converts the sequence of audio samples into an electrical audio signal. The electrical audio signal is then transmitted to a speaker of audio device 1332, which, in response, generates an acoustic output.

In situations where the bandwidth of distribution infrastructure 1110 is limited and/or variable, playback application 1310 downloads and buffers consecutive portions of video data and/or audio data from video encodings with different bit rates based on a variety of factors (e.g., scene complexity, audio complexity, network bandwidth, device capabilities, etc.). In some embodiments, video playback quality is prioritized over audio playback quality. Audio playback and video playback quality are also balanced with each other, and in some embodiments audio playback quality is prioritized over video playback quality.

Graphics interface 1326 is configured to generate frames of video data and transmit the frames of video data to graphics device 1328. In one embodiment, graphics interface 1326 is included as part of an integrated circuit, along with processor 1122. Alternatively, graphics interface 1326 is configured as a hardware accelerator that is distinct from (i.e., is not integrated within) a chipset that includes processor 1122.

Graphics interface 1326 generally represents any type or form of device configured to forward images for display on graphics device 1328. For example, graphics device 1328 is fabricated using liquid crystal display (LCD) technology, cathode-ray technology, and light-emitting diode (LED) display technology (either organic or inorganic). In some embodiments, graphics device 1328 also includes a virtual reality display and/or an augmented reality display. Graphics device 1328 includes any technically feasible means for generating an image for display. In other words, graphics device 1328 generally represents any type or form of device capable of visually displaying information forwarded by graphics interface 1326.

As illustrated in FIG. 13, content player 1120 also includes at least one input device 1336 coupled to communication infrastructure 1302 via input interface 1334. Input device 1336 generally represents any type or form of computing device capable of providing input, either computer or human generated, to content player 1120. Examples of input device 1336 include, without limitation, a keyboard, a pointing device, a speech recognition device, a touch screen, a wearable device (e.g., a glove, a watch, etc.), a controller, variations or combinations of one or more of the same, and/or any other type or form of electronic input mechanism.

Content player 1120 also includes a storage device 1340 coupled to communication infrastructure 1302 via a storage interface 1338. Storage device 1340 generally represents any type or form of storage device or medium capable of storing data and/or other computer-readable instructions. For example, storage device 1340 may be a magnetic disk drive, a solid-state drive, an optical disk drive, a flash drive, or the like. Storage interface 1338 generally represents any type or form of interface or device for transferring data between storage device 1340 and other components of content player 1120.

Many other devices or subsystems are included in or connected to content player 1120. Conversely, one or more of the components and devices illustrated in FIG. 13 need not be present to practice the embodiments described and/or illustrated herein. The devices and subsystems referenced above are also interconnected in different ways from that shown in FIG. 13. Content player 1120 is also employed in any number of software, firmware, and/or hardware configurations. For example, one or more of the example embodiments disclosed herein are encoded as a computer program (also referred to as computer software, software applications, computer-readable instructions, or computer control logic) on a computer-readable medium. The term "computer-readable medium," as used herein, refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, etc.), optical-storage media (e.g., Compact Disks (CDs), Digital Video Disks (DVDs), and BLU-RAY disks), electronic-storage media (e.g., solid-state drives and flash media), and other digital storage systems.

A computer-readable medium containing a computer program is loaded into content player 1120. All or a portion of the computer program stored on the computer-readable medium is then stored in memory 1124 and/or storage device 1340. When executed by processor 1122, a computer program loaded into memory 1124 causes processor 1122 to perform and/or be a means for performing the functions of one or more of the example embodiments described and/or illustrated herein. Additionally or alternatively, one or more of the example embodiments described and/or illustrated herein are implemented in firmware and/or hardware. For example, content player 1120 is configured as an Application Specific Integrated Circuit (ASIC) adapted to implement one or more of the example embodiments disclosed herein.

EXAMPLE EMBODIMENTS

1. A computer-implemented method comprising: accessing data that is to be used as part of a test implementation that has a plurality of potential outcomes; determining that the test implementation is to be carried out using one or more specified testing algorithms that test for at least one of the potential outcomes; identifying portions of the accessed data that are to be used in the specified testing algorithms; compressing the identified portions of the accessed data to remove portions of the accessed data that are unused in the specified testing algorithms; and executing the test implementation using the specified testing algorithms with the compressed accessed data.

2. The computer-implemented method of claim 1, wherein compressing the identified portions of the accessed data to remove portions of the accessed data that are unused in the specified testing algorithms comprises categorizing portions of the data that are used in the specified testing algorithms into bins.

3. The computer-implemented method of claim 2, wherein each bin includes data for a subset of users that are part of the test implementation.

4. The computer-implemented method of claim 3, wherein each bin is labeled with a tag that is part of a schema that tracks those portions of the accessed data that are used in the specified testing algorithms.

5. The computer-implemented method of claim 1, wherein compressing the identified portions of the accessed data to remove portions of the accessed data that are unused in the specified testing algorithms further includes tracking at least one of count, sum, or sum of squares.

6. The computer-implemented method of claim 1, wherein compressing the identified portions of the accessed data to remove portions of the accessed data that are unused in the specified testing algorithms is performed by a compression algorithm that is configured for implementation with at least one of: mathematical models, t tests, covariate adjustments, longitudinal models, quantile bootstrap, or quantile regression.

7. The computer-implemented method of claim 1, wherein compressing the identified portions of the accessed data to remove portions of the accessed data that are unused in the specified testing algorithms includes at least one of compression within data clusters that is configured to compress data within one or more data clusters or compression between data clusters that is configured to compress data in different data clusters.

8. The computer-implemented method of claim 1, wherein compressing the identified portions of the accessed data to remove portions of the accessed data that are unused in the specified testing algorithms is performed by a compression algorithm that is tunably lossy, such that controllers determine how much data loss through compression is tolerable for that compression operation.

9. The computer-implemented method of claim 1, wherein at least one of the test implementation or the specified testing algorithms are updated while the test implementation is testing.

10. The computer-implemented method of claim 9, wherein intermediate results from the executed test implementation are presented while the test implementation is executing.

11. The computer-implemented method of claim 10, wherein the intermediate results indicate whether a specified difference in features is having an expected effect.

12. A system comprising: at least one physical processor; and physical memory comprising computer-executable instructions that, when executed by the physical processor, cause the physical processor to: access data that is to be used as part of a test implementation that has a plurality of potential outcomes; determine that the test implementation is to be carried out using one or more specified testing algorithms that test for at least one of the potential outcomes; identify portions of the accessed data that are to be used in the specified testing algorithms; compress the identified portions of the accessed data to remove portions of the accessed data that are unused in the specified testing algorithms; and execute the test implementation using the specified testing algorithms with the compressed accessed data.

13. The system of claim 12, wherein the specified testing algorithms are optimized to reduce processing resource usage.

14. The system of claim 13, wherein the specified testing algorithms optimized to reduce processing resource usage comprise testing algorithms that operate using sparse linear algebra.

15. The system of claim 13, wherein the specified testing algorithms optimized to reduce processing resource usage comprise testing algorithms that operate using summing operations.

16. The system of claim 12, further comprising organizing the compressed accessed data in memory to spatially locate portions of the compressed accessed data next to each other in a data storage medium.

17. The system of claim 16, wherein organizing the compressed accessed data in memory to spatially locate portions of the compressed accessed data next to each other in a data storage medium includes arranging the compressed accessed data according to assigned vectors.

18. The system of claim 17, further comprising moving a chunk of compressed accessed data, arranged according to the assigned vectors, to a cache memory location located on the at least one physical processor.

19. The system of claim 18, wherein matrix sum operations are performed on the chunk of compressed accessed data that was moved to the cache memory location located on the at least one physical processor.

20. A non-transitory computer-readable medium comprising one or more computer-executable instructions that, when executed by at least one processor of a computing device, cause the computing device to: access data that is to be used as part of a test implementation that has a plurality of potential outcomes; determine that the test implementation is to be carried out using one or more specified testing algorithms that test for at least one of the potential outcomes; identify portions of the accessed data that are to be used in the specified testing algorithms; compress the identified portions of the accessed data to remove portions of the accessed data that are unused in the specified testing algorithms; and execute the test implementation using the specified testing algorithms with the compressed accessed data.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed, transform the data, output a result of the transformation to implement a test, use the result of the transformation to evaluate the test, and store the result of the transformation for presentation and longevity. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computer-implemented method comprising:
accessing data that is to be used as part of a test implementation that has a plurality of potential outcomes;
determining that the test implementation is to be carried out using one or more specified testing algorithms that test for at least one of the potential outcomes;
identifying portions of the accessed data that are to be used in the specified testing algorithms;
compressing the identified portions of the accessed data to remove portions of the accessed data that are unused in the specified testing algorithms; and
executing the test implementation using the specified testing algorithms with the compressed accessed data, wherein the specified testing algorithms are optimized to reduce processing resource usage, and wherein the specified testing algorithms optimized to reduce processing resource usage comprise testing algorithms that operate using sparse linear algebra.

2. The computer-implemented method of claim 1, wherein compressing the identified portions of the accessed data to remove portions of the accessed data that are unused in the specified testing algorithms comprises categorizing portions of the data that are used in the specified testing algorithms into bins.

3. The computer-implemented method of claim 2, wherein each bin includes data for a subset of users that are part of the test implementation.

4. The computer-implemented method of claim 3, wherein each bin is labeled with a tag that is part of a schema that tracks those portions of the accessed data that are used in the specified testing algorithms.

5. The computer-implemented method of claim 1, wherein compressing the identified portions of the accessed data to remove portions of the accessed data that are unused in the specified testing algorithms further includes tracking at least one of count, sum, or sum of squares.

6. The computer-implemented method of claim 1, wherein compressing the identified portions of the accessed data to remove portions of the accessed data that are unused in the specified testing algorithms is performed by a compression algorithm that is configured for implementation with at least one of:
mathematical models,
t tests,
covariate adjustments,
longitudinal models,
quantile bootstrap, or
quantile regression.

7. The computer-implemented method of claim 1, wherein compressing the identified portions of the accessed data to remove portions of the accessed data that are unused in the specified testing algorithms includes at least one of compression within data clusters that is configured to compress data within one or more data clusters or compression between data clusters that is configured to compress data in different data clusters.

8. The computer-implemented method of claim 1, wherein compressing the identified portions of the accessed data to remove portions of the accessed data that are unused in the specified testing algorithms is performed by a compression algorithm that is tunably lossy, such that controllers determine how much data loss through compression is tolerable for that compression operation.

9. The computer-implemented method of claim 1, wherein at least one of the test implementation or the specified testing algorithms are updated while the test implementation is testing.

10. The computer-implemented method of claim 9, wherein intermediate results from the executed test implementation are presented while the test implementation is executing.

11. The computer-implemented method of claim 10, wherein the intermediate results indicate whether a specified difference in features is having an expected effect.

12. A system comprising:
at least one physical processor; and
physical memory comprising computer-executable instructions that, when executed by the physical processor, cause the physical processor to:
access data that is to be used as part of a test implementation that has a plurality of potential outcomes;
determine that the test implementation is to be carried out using one or more specified testing algorithms that test for at least one of the potential outcomes;
identify portions of the accessed data that are to be used in the specified testing algorithms;
compress the identified portions of the accessed data to remove portions of the accessed data that are unused in the specified testing algorithms; and
execute the test implementation using the specified testing algorithms with the compressed accessed data, wherein the specified testing algorithms are optimized to reduce processing resource usage, and wherein the specified testing algorithms optimized to reduce processing resource usage comprise testing algorithms that operate using sparse linear algebra.

13. The system of claim 12, wherein the specified testing algorithms optimized to reduce processing resource usage comprise testing algorithms that operate using summing operations.

14. The system of claim 12, further comprising organizing the compressed accessed data in memory to spatially locate portions of the compressed accessed data next to each other in a data storage medium.

15. The system of claim 14, wherein organizing the compressed accessed data in memory to spatially locate portions of the compressed accessed data next to each other in a data storage medium includes arranging the compressed accessed data according to assigned vectors.

16. The system of claim 15, further comprising moving a chunk of compressed accessed data, arranged according to the assigned vectors, to a cache memory location located on the at least one physical processor.

17. The system of claim 16, wherein matrix sum operations are performed on the chunk of compressed accessed data that was moved to the cache memory location located on the at least one physical processor.

18. A non-transitory computer-readable medium comprising one or more computer-executable instructions that, when executed by at least one processor of a computing device, cause the computing device to:
access data that is to be used as part of a test implementation that has a plurality of potential outcomes;
determine that the test implementation is to be carried out using one or more specified testing algorithms that test for at least one of the potential outcomes;
identify portions of the accessed data that are to be used in the specified testing algorithms;

compress the identified portions of the accessed data to remove portions of the accessed data that are unused in the specified testing algorithms; and execute the test implementation using the specified testing algorithms with the compressed accessed data, wherein the specified testing algorithms are optimized to reduce processing resource usage, and wherein the specified testing algorithms optimized to reduce processing resource usage comprise testing algorithms that operate using sparse linear algebra.

19. The system of claim 12, wherein compressing the identified portions of the accessed data to remove portions of the accessed data that are unused in the specified testing algorithms comprises categorizing portions of the data that are used in the specified testing algorithms into bins.

20. The system of claim 19, wherein each bin includes data for a subset of users that are part of the test implementation.

* * * * *